United States Patent
Nakamura

(10) Patent No.: US 12,288,517 B2
(45) Date of Patent: Apr. 29, 2025

(54) DISPLAY DEVICE

(71) Applicant: SHARP KABUSHIKI KAISHA, Sakai (JP)

(72) Inventor: Kohzoh Nakamura, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 18/272,479

(22) PCT Filed: Jan. 19, 2021

(86) PCT No.: PCT/JP2021/001677
§ 371 (c)(1),
(2) Date: Jul. 14, 2023

(87) PCT Pub. No.: WO2022/157829
PCT Pub. Date: Jul. 28, 2022

(65) Prior Publication Data
US 2024/0087513 A1    Mar. 14, 2024

(51) Int. Cl.
*G09G 3/3225* (2016.01)
*H10K 59/131* (2023.01)

(52) U.S. Cl.
CPC ......... *G09G 3/3225* (2013.01); *H10K 59/131* (2023.02); *G09G 2300/0426* (2013.01);
(Continued)

(58) Field of Classification Search
CPC .... H10K 59/131; H10K 59/121; H10K 59/12; H10K 59/353; H10K 59/352; G09G 9/302; G09G 2300/0452; G09G 2300/0426; G09G 2300/0465; G09G 2320/0686; G06F 1/1686; G06F 1/1684; G06F 1/1658; G06F 3/0446; G02F 1/13306; H04N 23/55; H04N 23/57; G09F 9/302
See application file for complete search history.

(56) References Cited

U.S. PATENT DOCUMENTS

2014/0266995 A1* 9/2014 Cho ............... G09G 3/3607
345/88
2015/0103103 A1* 4/2015 Kim ............... G09G 3/3233
345/690
(Continued)

FOREIGN PATENT DOCUMENTS

CN    111047967 A    4/2020
JP    2010-230797 A    10/2010

*Primary Examiner* — Robin J Mishler
*Assistant Examiner* — Amen W Bogale
(74) *Attorney, Agent, or Firm* — ScienBiziP, P.C.

(57) ABSTRACT

A display device includes a plurality of scanning signal lines; a plurality of data signal lines; and a plurality of subpixel circuits disposed at least at some of intersection points of the plurality of scanning signal lines and the plurality of data signal lines, each one of the plurality of subpixel circuits including a control circuit including a transistor and a light-emitting element, wherein an average density of subpixel circuits provided in a display region is greater than an average density of the subpixel circuits provided in a sparse pixel region, and the sparse pixel region includes a no-pixel region not including the subpixel circuits in one entire line in an extending direction of the scanning signal lines or the data signal lines-provided in the display region.

10 Claims, 21 Drawing Sheets

(52) U.S. Cl.
CPC ............... *G09G 2300/0452* (2013.01); *G09G 2300/0819* (2013.01); *G09G 2300/0842* (2013.01); *G09G 2300/0861* (2013.01); *G09G 2320/0242* (2013.01)

(56) References Cited

U.S. PATENT DOCUMENTS

| | | | |
|---|---|---|---|
| 2016/0064458 A1* | 3/2016 | Lee | H10K 59/353 |
| | | | 345/694 |
| 2017/0207281 A1* | 7/2017 | Hack | H10K 59/353 |
| 2020/0227488 A1* | 7/2020 | Xin | H10K 59/1213 |
| 2021/0191552 A1* | 6/2021 | Bok | G06F 1/1643 |
| 2021/0208633 A1* | 7/2021 | Ma | G02F 1/13306 |
| 2021/0210510 A1 | 7/2021 | Hsieh | |
| 2021/0287630 A1* | 9/2021 | Kim | G06V 10/147 |
| 2022/0246688 A1* | 8/2022 | Park | H10K 59/121 |
| 2022/0271113 A1* | 8/2022 | Zhou | G09G 3/20 |
| 2023/0081320 A1 | 3/2023 | Hsieh | |
| 2023/0371307 A1* | 11/2023 | Lee | H10K 59/121 |

\* cited by examiner

DISPLAY DEVICE

TECHNICAL FIELD

The disclosure relates to a display device.

BACKGROUND ART

The display device described in PTL 1 includes display pixels also in a region overlapping an imaging element in a plan view and can perform display in the region even when capturing an image of a subject.

CITATION LIST

Patent Literature

PTL 1: JP 2010-230797 A

SUMMARY

Technical Problem

However, the display device described in PTL 1 has a configuration in which display pixels are not provided in a part of one row or a part of one column in a region overlapping the imaging element in a plan view. Thus, in the case of the display device described in PTL 1, it is necessary to linearly provide a scanning signal line for each row and linearly provide a data signal line for each column in a region overlapping the imaging element in a plan view. However, problematically, diffraction light is caused by the effects of the wiring line pitch of the plurality of scanning signal lines linearly provided in the region overlapping the imaging element in a plan view and the wiring line pitch of the plurality of data signal lines linearly provided in the region overlapping the imaging element in a plan view, in other words, the wiring line pitches being close to the visible light wavelength, and a spectrally separated (colored) image is captured by the imaging element. Furthermore, the transmittance in the region overlapping the imaging element in a plan view cannot be improved via a diffraction effect.

An aspect of the disclosure is made in light of the problems described above, and an object of the disclosure is to provide a display device that can perform a display in a sparse pixel region, suppress the occurrence of diffraction light in the sparse pixel region, and improve transmittance and reduce coloring in the sparse pixel region.

Solution to Problem

To resolve the problems described above, a display device of the disclosure includes:
- a plurality of scanning signal lines;
- a plurality of data signal lines; and
- a plurality of subpixel circuits disposed at least at some of intersection points of the plurality of scanning signal lines and the plurality of data signal lines, each one of the plurality of subpixel circuits including a control circuit including a transistor and a light-emitting element, wherein an average density of subpixel circuits provided in a display region (number of subpixel circuits provided in the display region/area of a display region) is greater than an average density of subpixel circuits provided in a sparse pixel region (number of subpixel circuits provided in the sparse pixel region/area of a sparse pixel region), and the sparse pixel region includes a no-pixel region not including the subpixel circuits in one entire line in an extending direction of the scanning signal lines or the data signal lines provided in the display region.

Advantageous Effects of Disclosure

An aspect of the disclosure provides a display device that can perform a display in a sparse pixel region, suppress the occurrence of diffraction light in the sparse pixel region, and improve transmittance and reduce coloring in the sparse pixel region.

DESCRIPTION OF EMBODIMENTS

Figure 1:
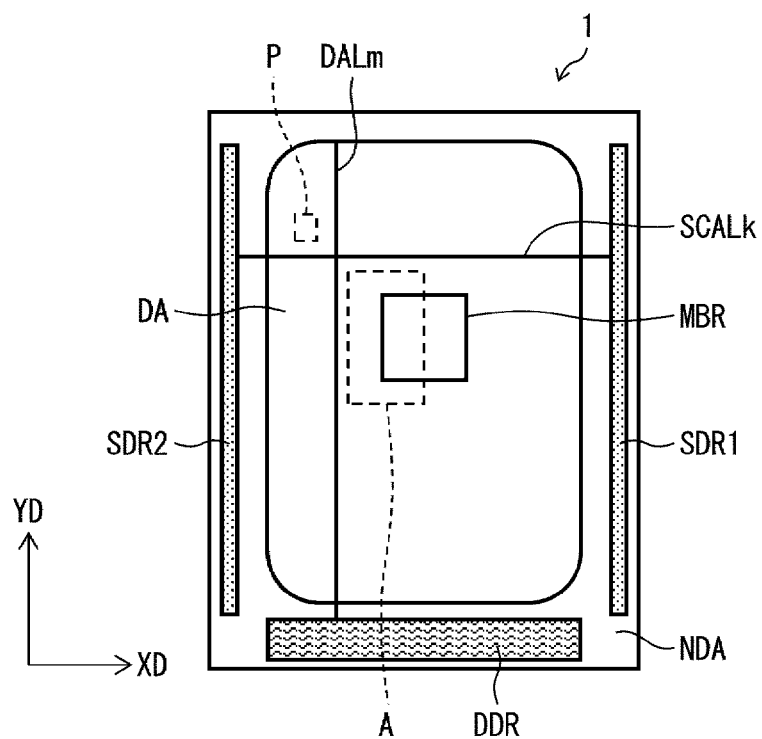
FIG. 1 is a schematic plan view illustrating a configuration of a display device according to a first embodiment.

Embodiments of the disclosure will be described below with reference to FIGS. 1 to 21. Hereinafter, for convenience of explanation, components having the same functions as those described in a specific embodiment are denoted by the same reference numerals, and descriptions thereof will be omitted.

First Embodiment

FIG. 1 is a schematic plan view illustrating a configuration of a display device 1 according to the first embodiment.

The display device 1 includes a frame region NDA, a display region DA, and a sparse pixel region MBR. A camera (not illustrated), an example of an imaging element, is provided on the back face of the display device 1 so as to overlap the sparse pixel region MBR in a plan view.

Note that in the example of the present embodiment described herein, the sparse pixel region MBR is provided in a central portion of the display device 1. However, no such limitation is intended, and in another example, the sparse pixel region MBR may be provided close to one end portion of the display device 1, in other words, close to one end portion of the display region DA.

In addition, in the example of the present embodiment described herein, the sparse pixel region MBR is quadrangular. However, no such limitation is intended, and in another example, the shape of the sparse pixel region MBR may be circular or elliptical, with the shape being able to be determined as appropriate.

A plurality of pixels P are provided in the display region DA of the display device 1, and each pixel P includes a red subpixel, a green subpixel, and a blue subpixel. In the example of the present embodiment described herein, one pixel P includes a red subpixel, a green subpixel, and a blue subpixel, but no such limitation is intended. For example, one pixel P may further include a subpixel of another color in addition to the red subpixel, the green subpixel, and the blue subpixel.

As illustrated in FIG. 1, as in a known display device, a plurality of scanning signal lines SCALk linearly formed in an X-direction XD and a plurality of data signal lines DALm linearly formed in a Y-direction YD are formed in the display region DA where the sparse pixel region MBR has no effect, that is, a region where the scanning signal lines SCALk (k being a natural number equal to or greater than 1) can be linearly formed from the left end of the display region DA to the right end without passing through the sparse pixel region MBR and a region where the data signal lines DALm (m being a natural number equal to or greater than 1) can be linearly formed from the upper end of the display region DA to the lower end without passing through the sparse pixel region MBR.

In the display device 1 according the first embodiment, in the display region DA where the sparse pixel region MBR has an effect, that is, the display region DA on the upper, lower, left, and right side of the sparse pixel region MBR and the sparse pixel region MBR, the scanning signal lines SCALk and the data signal lines DALm are formed as described below.

In the present embodiment, in the display region DA on the left side of the sparse pixel region MBR, the display region DA on the right side of the sparse pixel region MBR, and the sparse pixel region MBR, the plurality of scanning signal lines SCALk are linearly formed in the X-direction XD as with the display region DA where the sparse pixel region MBR has no effect as described above. However, no such limitation is intended.

On the other hand, in the present embodiment, in the display region DA on the upper side of the sparse pixel region MBR, the plurality of data signal lines DALm are linearly formed in the Y-direction YD from the upper end of the display region DA to the upper end of the sparse pixel region MBR, and in the display region DA on the lower side of the sparse pixel region MBR, the plurality of data signal lines DALm are linearly formed in the Y-direction YD from the lower end of the display region DA to the lower end of the sparse pixel region MBR. However, no such limitation is intended.

The plurality of data signal lines DALm formed in the display region DA on the upper side of the sparse pixel region MBR and the plurality of data signal lines DALm formed in the display region DA on the lower side of the sparse pixel region MBR are electrically connected via the plurality of data signal lines DALm formed in the sparse pixel region MBR described below.

Each one of the plurality of data signal lines DALm and each one of the plurality of scanning signal lines SCALk are formed of a single-layer film or a layered film of a metal including at least one of aluminum, tungsten, molybdenum, tantalum, chromium, titanium, or copper, for example, and each one of the plurality of data signal lines DALm and each one of the plurality of scanning signal lines SCALk are formed in different layers. Note that "formed in different layers" means that, for example, an insulating layer is formed between each one of the plurality of data signal lines DALm and each one of the plurality of scanning signal lines SCALk, ensuring insulating properties between each one of the plurality of data signal lines DALm and each one of the plurality of scanning signal lines SCALk.

Note that in the display region DA, a subpixel circuit (not illustrated) described later is provided at an intersection point of each one of the plurality of data signal lines DALm and each one of the plurality of scanning signal lines SCALk.

In the example of the present embodiment described herein, a data drive circuit DDR, which is a data signal source and an ELVDD signal source, is provided in the lower portion of the frame region NDA of the display device 1; a first scan drive circuit SDR1, which is a scanning signal source and an emission control signal source, is provided in the right portion of the frame region NDA of the display device 1; and a second scan drive circuit SDR2, which is a scanning signal source and an emission control signal source, is provided in the left portion of the frame region NDA of the display device 1. However, no such limitation is intended.

Figure 2:
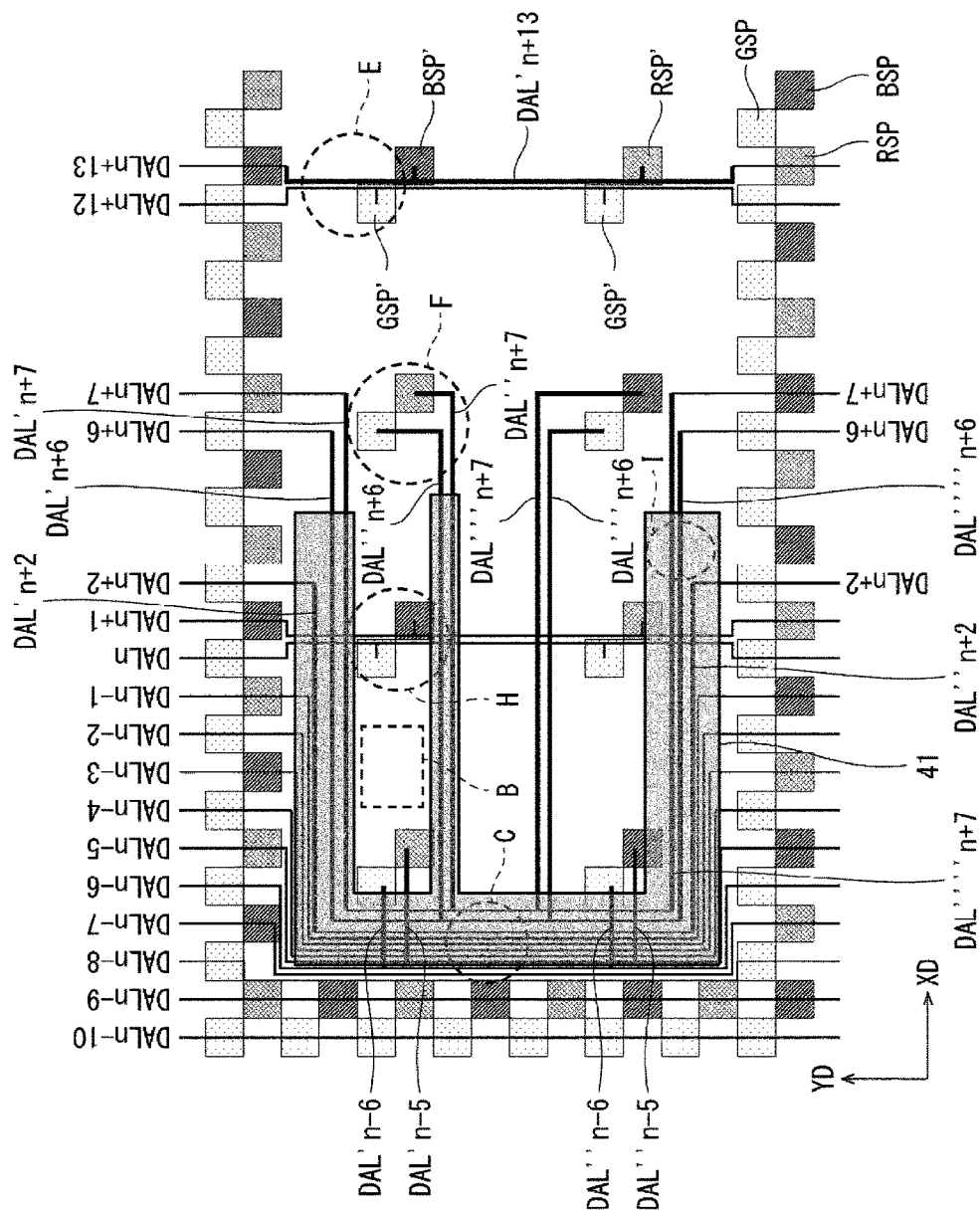
FIG. 2 is a partial enlarged view of a section A of the display device according to the first embodiment illustrated in FIG. 1.

FIG. 2 is a partial enlarged view of a section A of the display device 1 illustrated in FIG. 1.

Note that in FIG. 2, the plurality of scanning signal lines linearly formed in the display region DA and the sparse pixel region MBR are omitted from the diagram.

As illustrated in FIG. 2, in the display region DA, red subpixels RSP, green subpixels GSP, and blue subpixels BSP are disposed in a relatively high density. On the other hand, in the sparse pixel region MBR, the subpixels of each color are reduced in number, and red subpixels RSP', green subpixels GSP', and blue subpixels BSP' are disposed in a relatively low density.

The density in the display region DA can be obtained from (number of subpixels formed in the display region DA/area of the display region DA), and the density of the sparse pixel region MBR can be obtained from (number of subpixels formed in the sparse pixel region MBR/area of the sparse pixel region MBR).

In the example of the present embodiment described herein, the size and shape of the red subpixels RSP provided in the display region DA and the size and shape of the red subpixels RSP' provided in the sparse pixel region MBR are the same, the size and shape of the green subpixels GSP provided in the display region DA and the size and shape of the green subpixels GSP' provided in the sparse pixel region MBR are the same, and the size and shape of the blue subpixels BSP provided in the display region DA and the size and shape of the blue subpixels BSP' provided in the sparse pixel region MBR are the same. However, no such limitation is intended. In another example, the size and/or the shape of the subpixels of a specific color provided in the display region DA may be different from the size and/or shape of the subpixels of the same specific color provided in the sparse pixel region MBR.

In the present embodiment, the size of the green subpixels GSP' is smaller than the size of the red subpixels RSP' and the size of the blue subpixel BSP'. Thus, taking into account the distribution of color in the sparse pixel region MBR, the number of green subpixels GSP' is made to match the combined number of red subpixels RSP' and blue subpixels BSP', and one green subpixels GSP' is disposed adjacent to one red subpixels RSP' or one blue subpixel BSP'. However, no such limitation is intended. That is, the number of subpixels of each color remaining in the sparse pixel region MBR may be determined as appropriate taking into account the size of the subpixels of each color provided in the sparse pixel region MBR. Also, the subpixels of each color provided in the sparse pixel region MBR may be disposed adjacent to one another, or each one may be disposed with a certain interval therebetween.

As illustrated in FIG. 2, the data signal line DALn−9 and the data signal line DALn−10 (n is a natural number equal to or greater than 11) are examples of the data signal lines provided in the display region DA where the sparse pixel region MBR has no effect. The data signal line DALn−9 and the data signal line DALn−10 are linearly formed in the Y-direction YD from the upper end of the display region DA to the lower end.

As illustrated in FIG. 2, the sparse pixel region MBR includes a no-pixel region not including the subpixel circuit described below in one entire line in the X-direction XD, that is the extending direction of the scanning signal lines provided in the display region DA, or in the Y-direction YD, that is the extending direction of the data signal lines provided in the display region DA (in the present embodiment, the sparse pixel region MBR of the display device 1 includes a no-pixel region not including the subpixel circuit in one entire line in the Y-direction YD, that is the extending direction of the data signal lines provided in the display region DA).

As illustrated in FIG. 2, for example, each one of the data signal lines DALn+2, DALn−1 to DALn−4, DALn−7, and DALn−8 (third data signal lines) corresponds to, in the sparse pixel region MBR, a no-pixel region not including the subpixel circuit described below in one entire line in the Y-direction YD, that is the extending direction of these data signal lines provided in the display region DA.

Figure 3:
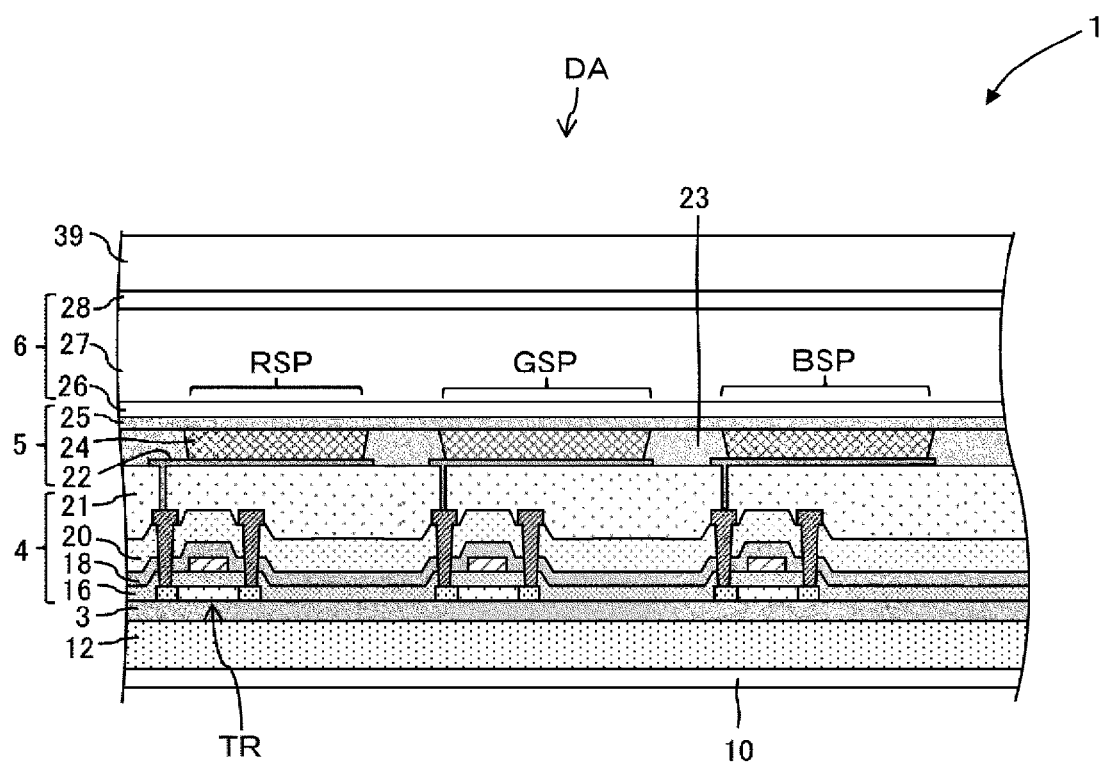
FIG. 3 is a schematic cross-sectional view illustrating a configuration of a display region of the display device according to the first embodiment illustrated in FIG. 1.

FIG. 3 is a schematic cross-sectional view illustrating a configuration of the display region DA of the display device 1.

As illustrated in FIG. 3, in the display region DA of the display device 1, a lower face film 10, a resin layer 12, a barrier layer 3, various insulating layers 4 including a transistor TR, a light-emitting element 5, a transparent resin layer (bank) 23, a sealing layer 6, and a function film 39 are provided in this order from the lower face film 10 side.

As illustrated in FIGS. 2 and 3, the red subpixels RSP, the green subpixels GSP, and the blue subpixels BSP are provided in the display region DA of the display device 1. The red subpixel RSP, the green subpixel GSP, and the blue subpixel BSP each include the light-emitting element 5. The light-emitting element 5 included in the red subpixel RSP includes an anode 22, a function layer 24 including a red light-emitting layer, and a cathode 25; the light-emitting element 5 included in the green subpixel GSP includes the anode 22, the function layer 24 including a green light-emitting layer, and the cathode 25; and the light-emitting element 5 included in the blue subpixel BSP includes the anode 22, the function layer 24 including a blue light-emitting layer, and the cathode 25.

The red subpixel RSP', the green subpixel GSP', and the blue subpixel BSP' provided in the sparse pixel region MBR illustrated in FIG. 2 have the same configuration as the red subpixel RSP, the green subpixel GSP, and the blue subpixel BSP provided in the display region DA and include the light-emitting element 5.

As illustrated in FIG. 3, the lower layer of the red subpixel RSP, the green subpixel GSP, and the blue subpixel BSP provided in the display region DA corresponds to the various insulating layers 4 including the transistor TR, and, though no illustrated, the lower layer of the red subpixel RSP', the green subpixel GSP', and the blue subpixel BSP' provided in the sparse pixel region MBR also corresponds to the various insulating layers 4 including the transistor TR.

The lower face film 10 is, for example, a PET film or the like.

Examples of the material of the resin layer 12 include polyimide.

In the example of the present embodiment described herein, the display device 1 is a flexible display device and thus includes the lower face film 10 and the resin layer 12. However, no such limitation is intended. In an example in which the display device 1 is a non-flexible display device, a glass substrate may be used instead of the lower face film 10, and the barrier layer 3 described below may be directly provided on the glass substrate.

The barrier layer 3 is a layer that inhibits foreign matter, such as water and oxygen, from penetrating through to the transistor TR and the light-emitting element 5. For example, the barrier layer 3 can be formed of a silicon oxide film, a silicon nitride film, or a silicon oxynitride film, or a layered film thereof formed by chemical vapor deposition (CVD).

The transistor TR portion of the various insulating layers 4 including the transistor TR includes a semiconductor film, an inorganic insulating film 16, a gate electrode, an inorganic insulating film 18, an inorganic insulating film 20, a source electrode, a drain electrode, and a flattening film 21. The non-transistor TR portion of the various insulating layers 4 including the transistor TR includes the inorganic insulating film 16, the inorganic insulating film 18, the inorganic insulating film 20, and the flattening film 21.

The semiconductor film may be formed of low-temperature polysilicon (LTPS) or an oxide semiconductor (for example, an In—Ga—Zn—O based semiconductor), for example. In the example of the present embodiment described herein, the transistor TR has a top gate structure. However, no such limitation is intended, and the transistor TR may have a bottom gate structure.

The gate electrode, the source electrode, and the drain electrode may be formed of a single-layer film or a layered film of a metal including, for example, at least one of aluminum, tungsten, molybdenum, tantalum, chromium, titanium, or copper.

The inorganic insulating film 16, the inorganic insulating film 18, and the inorganic insulating film 20 may be formed of a silicon oxide film, a silicon nitride film, a silicon-oxide-nitride film, or a layered film of these, formed using CVD.

The flattening film 21 may be formed of coatable organic materials such as polyimide and acrylic.

The light-emitting element 5 includes the anode 22 in a layer above the flattening film 21, the function layer 24 including a light-emitting layer, and the cathode 25. Note that transparent resin layer (bank) 23 with insulating properties covering the edge of the anode 22 is formed, for example, by applying an organic material, such as polyimide or acrylic, and then patterning the organic material by photolithography.

The function layer 24 including a light-emitting layer may be formed by layering, for example, a hole injection layer, a hole transport layer, a light-emitting layer, an electron transport layer, and an electron injection layer in that order from the anode 22 side. Of the hole injection layer, the hole transport layer, the electron transport layer, and the electron injection layer in the function layer 24 including a light-emitting layer, one or more layers may be omitted as appropriate.

Note that when the light-emitting element 5 is an organic light-emitting diode (OLED), the light-emitting layer included in the function layer 24 is, for example, an organic light-emitting layer formed by vapor deposition. When the light-emitting element 5 is a quantum dot light-emitting diode (QLED), the light-emitting layer included in the function layer 24 is, for example, a light-emitting layer including quantum dots formed by an ink-jet method or an application method.

The light-emitting element 5 including the island-shaped anode 22, the function layer 24, and the cathode 25 is provided in each red subpixel RSP, green subpixel GSP, and blue subpixel BSP. A control circuit including the transistor TR that controls each light-emitting element 5 is provided in the various insulating layers 4 including the transistor TR for each red subpixel RSP, green subpixel GSP, and blue subpixel BSP. Note that a subpixel circuit provided for each red subpixel RSP, green subpixel GSP, and blue subpixel BSP includes a control circuit including the transistor TR and the light-emitting element 5. This is described below in detail.

The light-emitting element 5 illustrated in FIG. 3 may be a top-emitting type or a bottom-emitting type. When the light-emitting element 5 has an ordered-layered structure that includes the anode 22, the function layer 24 including a light-emitting layer, and the cathode 25 formed in this order from the lower face film 10 side, the cathode 25 is disposed as a layer above the anode 22. Thus, to realize a top-emitting type, the anode 22 is formed of an electrode material that reflects visible light and the cathode 25 is formed of an electrode material that allows visible light through. To realize a bottom-emitting type, the anode 22 is formed of an electrode material that allows visible light through and the cathode 25 is formed of an electrode material that reflects visible light. On the other hand, when the light-emitting element 5 has an inverse-layered structure that includes the cathode 25, the function layer 24 including a light-emitting layer, and the anode 22 formed in this order from the lower face film 10 side, the anode 22 is disposed as a layer above the cathode 25. Thus, to realize a top-emitting type, the cathode 25 is formed of an electrode material that reflects visible light and the anode 22 is formed of an electrode material that allows visible light through. To realize a bottom-emitting type, the anode 22 is formed of an electrode material that reflects visible light and the cathode 25 is formed of an electrode material that allows visible light through.

The electrode material that reflects visible light is not particularly limited as long as the material can reflect visible light and has electrical conductivity, Examples include metal materials such as Al, Mg, Li, and Ag, alloys of the metal materials, a layered body of the metal materials and transparent metal oxides (for example, indium tin oxide, indium zinc oxide, indium gallium zinc oxide, and the like), a layered body of the alloys and the transparent metal oxides.

On the other hand, the electrode material that allows visible light through is not particularly limited as long as the material can allow visible light through and has electrical conductivity. Examples include a thin film formed of a transparent metal oxide (for example, indium tin oxide, indium zinc oxide, indium gallium zinc oxide, and the like) or a metal material, such as Al, Mg, Li, and Ag.

A typical electrode forming method can be used as the method of forming the anode 22 and the cathode 25, and examples thereof include physical vapor deposition (PVD) such as vacuum vapor deposition, a sputtering method, electron beam (EB) vapor deposition, and an ion plating method, or chemical vapor deposition (CVD). Further, the method of patterning the anode 22 and the cathode 25 is not particularly limited as long as the method is capable of precisely forming a desired pattern, and specific examples include a photolithography method and an ink-jet method.

The sealing layer 6 is a transparent film and, for example, may be formed of an inorganic sealing film 26 for covering the cathode 25, an organic film 27 in a layer above the inorganic sealing film 26, and an inorganic sealing film 28 in a layer above the organic film 27. The sealing layer 6 inhibits foreign matter, such as water and oxygen, from penetrating through to the light-emitting element 5.

The inorganic sealing film 26 and the inorganic sealing film 28 are both inorganic films and may be formed of, for example, a silicon oxide film, a silicon nitride film, a silicon oxynitride film, or a layered film of these, formed by CVD. The organic film 27 is a transparent organic film having a flattening effect, and may be formed of a coatable organic material such as acrylic, for example. The organic film 27 may be formed by an ink-jet method, for example. In the example of the present embodiment described herein, the sealing layer 6 is formed of one layer of an organic film provided between two layers of an inorganic film and two layers of an inorganic film. However, the layering order of the two layers of an inorganic film and the one layer of an organic film is not limited thereto. Further, the sealing layer 6 may be formed of only an inorganic film, may be formed of only an organic film, may be formed of one layer of an inorganic film and two layers of an organic film, or may be formed of two or more layers of an inorganic film and two or more layers of an organic film.

The function film 39 is a film with at least one of an optical compensation function, a touch sensor function, or a protection function, for example.

Figure 4:
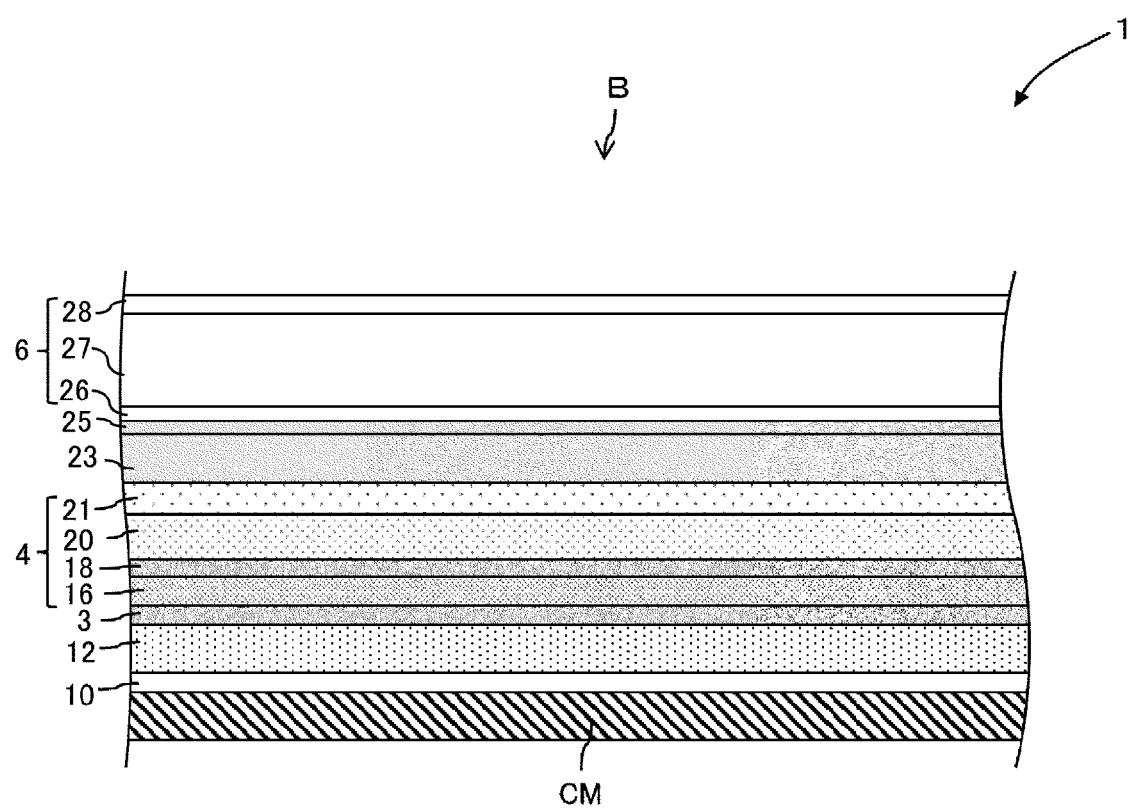
FIG. 4 is a schematic cross-sectional view illustrating a configuration of a section B of the partially enlarged view of the display device according to the first embodiment illustrated in FIG. 2.

FIG. 4 is a schematic cross-sectional view illustrating a configuration of a section B of the partially enlarged view of the display device 1 illustrated in FIG. 2.

Note that in FIG. 4 as in FIG. 2, the plurality of scanning signal lines linearly formed in the sparse pixel region MBR are omitted from the diagram.

The section B of the partially enlarged view of the display device 1 illustrated in FIG. 2 is a region in the sparse pixel region MBR where the red subpixels RSP', the green subpixels GSP', the blue subpixels BSP', and the data signal lines are not provided. Note that this region is a portion of the no-pixel region not including the subpixel circuit in one entire line in the Y-direction YD, that is the extending direction of the data signal lines provided in the display region DA.

As illustrated in FIG. 4, in the no-pixel region of the sparse pixel region MBR of the display device 1, the lower face film 10, the resin layer 12, the barrier layer 3, the various insulating layers 4 including the transistor TR, the transparent resin layer 23, and the sealing layer 6 are provided in this order from the lower face film 10 side. Note that in the example of the present embodiment described herein, the transparent resin layer 23 is provided in the no-pixel region of the sparse pixel region MBR of the display device 1. However, no such limitation is intended, and the transparent resin layer 23 may not be provided in the no-pixel region.

Since the red subpixels RSP', the green subpixels GSP', and the blue subpixels BSP' are formed in the no-pixel region of the sparse pixel region MBR of the display device 1, the light-emitting element 5 does not need to also be formed, and control circuit including the transistor TR for controlling the light-emitting element 5 also does not need to be formed. Accordingly, in the no-pixel region of the sparse pixel region MBR of the display device 1, a subpixel circuit including the control circuit including the transistor TR and the light-emitting element 5 is not formed.

As illustrated in FIGS. 2, 3, and 4, in the display device 1, the average density (number of the subpixel circuits provided in the display region DA/area of the display region DA) of the subpixel circuits provided in the display region DA is greater than the average density (number of the subpixel circuits provided in the sparse pixel region MBR/area of the sparse pixel region MBR) of the subpixel circuits provided in the sparse pixel region MBR.

As described above, since the display device 1 includes the red subpixels RSP', the green subpixels GSP', and the blue subpixels BSP' in the sparse pixel region MBR, a display can be performed in the sparse pixel region MBR. The sparse pixel region MBR of the display device 1 includes the no-pixel region not including the subpixel circuit in one entire line in the X-direction XD, that is the extending direction of the scanning signal lines provided in the display region DA, or in the Y-direction YD, that is the extending direction of the data signal lines provided in the display region DA (in the present embodiment, the sparse pixel region MBR of the display device 1 includes the no-pixel region not including the subpixel circuit in one entire line in the Y-direction YD, that is the extending direction of the data signal lines provided in the display region DA). Accordingly, in the no-pixel region of the sparse pixel region MBR, the data signal lines may not be formed, and the plurality of data signal lines can be collectively formed. Thus, in the sparse pixel region MBR of the display device 1, the occurrence of diffraction light caused by the effects of the wiring line pitch of the plurality of data signal lines linearly formed at a certain interval can be suppressed, and transmittance of the sparse pixel region MBR can be improved and coloring can be reduced.

However, in the present embodiment, as described above, in the sparse pixel region MBR as in the display region DA, the plurality of scanning signal lines are linearly formed in the X-direction XD. However, as illustrated in FIG. 2, for example, each one of the data signal lines DALn−1 to DALn−8, DALn+2, DALn+6, and DALn+7 (third data signal lines) is not linearly formed in the Y-direction YD, that is the extending direction of the data signal lines provided in the display region DA, in the sparse pixel region MBR.

As illustrated in FIG. 4, the display device 1 includes a camera CM, an example of an imaging element, on the lower face film 10 side or back face of the display device 1 overlapping the sparse pixel region MBR in a plan view.

As indicated by a broken line C in FIG. 2, each one of the data signal lines DALn−1 to DALn−8, DALn+2, DALn+6, and DALn+7 (third data signal lines) is formed following the edge portion of the sparse pixel region MBR in the sparse pixel region MBR. On the other hand, in the display region DA on the upper side of the sparse pixel region MBR, each one of the data signal lines DALn−1 to DALn−8, DALn+2, DALn+6, and DALn+7 is linearly formed in the Y-direction YD from the upper end of the display region DA to the upper end of the sparse pixel region MBR, and in the display region DA on the lower side of the sparse pixel region MBR, each one of the data signal lines DALn−1 to DALn−8, DALn+2, DALn+6, and DALn+7 is linearly formed in the Y-direction YD from the lower end of the display region DA to the lower end of the sparse pixel region MBR.

In the present embodiment, all of the data signal lines are formed, in the display region DA, in the same layer, that is, the layer forming the source electrode and the drain electrode of the transistor TR illustrated in FIG. 3. Each one of the data signal lines DALn and DALn+1 is formed, in the sparse pixel region MBR also, in the same layer as the display region DA, that is, the layer forming the source electrode and the drain electrode of the transistor TR illustrated in FIG. 3. For example, first wiring lines DAL'n−5, DAL"n−5, DAL'n−6, DAL"n−6, DAL'n+2, DAL"n+2, DAL'n+6 to DAL""n+6, and DAL'n+7 to DAL""n+7 (all indicated in FIG. 2 by a thick line), which are portions of the data signal lines DALn−5, DALn−6, DALn+2, DALn+6, and DALn+7 (third data signal lines), from among the data signal lines DALn−1 to DALn−8, DALn+2, DALn+6, and DALn+7 formed following the edge portion of the sparse pixel region MBR, that in the sparse pixel region MBR include a portion formed in the X-direction XD, that is the extending direction of the scanning signal lines, or in other words, a portion of the data signal lines DALn−5, DALn−6, DALn+2, DALn+6, and DALn+7 in the sparse pixel region MBR, are formed in a wiring line layer different from the layer forming the gate electrode of the transistor TR illustrated in FIG. 3 and different from the layer forming the source electrode and the drain electrode of the transistor TR illustrated in FIG. 3.

In particular, in the sparse pixel region MBR, the data signal lines DALn+2, DALn+6, and DALn+7 intersect the data signal lines DALn and DALn+1. Thus, with the configuration described above, insulating properties can be ensured between the data signal lines DALn+2, DALn+6, and DALn+7 and the data signal lines DALn and DALn+1. Also, in the sparse pixel region MBR, the data signal lines DALn−5 and DALn−6 intersect the other data signal lines. Thus, with the configuration described above, insulating properties can be ensured between the data signal lines DALn−5 and DALn−6 and the other data signal lines.

In the present embodiment, the first wiring lines, that is a portion, in the sparse pixel region MBR, of the data signal lines DALn−5, DALn−6, DALn+2, DALn+6, and DALn+7 that intersect other data signal lines are formed in a wiring line layer different from the layer forming the gate electrode of the transistor TR illustrated in FIG. 3 and different from the layer forming the source electrode and the drain electrode of the transistor TR illustrated in FIG. 3. However, no such limitation is intended. For example, the first wiring lines, that is a portion, in the sparse pixel region MBR, of the data signal lines DALn−1 to DALn−8, DALn+2, DALn+6, and DALn+7 including a portion formed in the X-direction XD, that is the extending direction of the scanning signal lines, may be formed in a wiring line layer different from the layer forming the gate electrode of the transistor TR illustrated in FIG. 3 and different from the layer forming the source electrode and the drain electrode of the transistor TR illustrated in FIG. 3.

The portion, in the sparse pixel region MBR, of the data signal lines DALn−5, DALn−6, DALn+2, DALn+6, and DALn+7 described above that is formed in a wiring line layer different from the layer forming the gate electrode of the transistor TR illustrated in FIG. 3 and different from the layer forming the source electrode and the drain electrode of the transistor TR illustrated in FIG. 3 and is formed in the X-direction XD, that is the extending direction of the scanning signal lines, preferably overlaps a portion of the plurality of scanning signal lines that are not illustrated, are formed in the X-direction XD, and are formed in the layer forming the gate electrode of the transistor TR illustrated in FIG. 3.

As illustrated in FIG. 2, the subpixel circuit (third subpixel circuit) provided in the upper left side of the sparse pixel region MBR, specifically, the subpixel circuit relating to the green subpixel GSP', and the data signal line DALn−6 (third data signal line) formed following the edge portion of the sparse pixel region MBR are electrically connected via the first wiring line DAL'n−6 including a portion formed in the X-direction XD, that is the extending direction of the scanning signal lines. Since the first wiring lines DAL'n−6 and DAL"n−6, which are portions of the data signal line DALn−6, intersect the data signal lines DALn−1 to DALn−5, DALn+2, DALn+6, and DALn+7 formed following the edge portion of the sparse pixel region MBR, in the present embodiment, the first wiring lines DAL'n−6 and DAL"n−6 of the data signal line DALn−6 and the portions of the data signal line DALn−6 other than the first wiring lines DAL'n−6 and DAL"n−6 are formed in different layers. For example, the first wiring lines DAL'n−6 and DAL"n−6 of the data signal line DALn−6 can be formed in a wiring line layer different from the layer forming the gate electrode of the transistor TR illustrated in FIG. 3 and different from the layer forming the source electrode and the drain electrode of the transistor TR illustrated in FIG. 3, and the portions of the data signal line DALn−6 other than the first wiring lines DAL'n−6 and DAL"n−6 can be formed in the layer forming the source electrode and the drain electrode of the transistor TR illustrated in FIG. 3. Note that in a similar manner, the green subpixel GSP' provided in the lower left side of the sparse pixel region MBR is electrically connected to the data signal line DALn−6 formed following the edge portion of the sparse pixel region MBR via the first wiring line DAL"n−6.

As illustrated in FIG. 2, the subpixel circuit (third subpixel circuit) provided in the upper left side of the sparse pixel region MBR, specifically, the subpixel circuit relating to the red subpixel RSP', and the data signal line DALn−5 formed following the edge portion of the sparse pixel region MBR are electrically connected via the first wiring line DAL'n−5 including a portion formed in the X-direction XD, that is the extending direction of the scanning signal lines. Since the first wiring lines DAL'n−5 and DAL"n−5, which are portions of the data signal line DALn−5, intersect the data signal lines DALn−1 to DALn−4, DALn+2, DALn+6, and DALn+7 formed following the edge portion of the sparse pixel region MBR, in the present embodiment, the first wiring lines DAL'n−5 and DAL"n−5 of the data signal line DALn−5 and the portions of the data signal line DALn−5 other than the first wiring lines DAL'n−5 and DAL"n−5 are formed in different layers. For example, the first wiring lines DAL'n−5 and DAL"n−5 of the data signal line DALn−5 can be formed in a wiring line layer different from the layer forming the gate electrode of the transistor TR illustrated in FIG. 3 and different from the layer forming the source electrode and the drain electrode of the transistor TR illustrated in FIG. 3, and the portions of the data signal line DALn−5 other than the first wiring lines DAL'n−5 and DAL"n−5 can be formed in the layer forming the source electrode and the drain electrode of the transistor TR illustrated in FIG. 3. Note that in a similar manner, the blue subpixel BSP' provided in the lower left side of the sparse pixel region MBR is electrically connected to the data signal line DALn−5 formed following the edge portion of the sparse pixel region MBR via the first wiring line DAL"n−5.

As indicated by a broken line F in FIG. 2, the subpixel circuit (third subpixel circuit) provided in the upper central side of the sparse pixel region MBR, specifically, the subpixel circuit relating to the green subpixel GSP', and the data signal line DALn+6 formed following the edge portion of the sparse pixel region MBR are electrically connected via the first wiring line DAL"n+6 including a portion formed in the X-direction XD, that is the extending direction of the scanning signal lines. Since the first wiring lines DAL'n+6, DAL"n+6, DAL'''n+6, and DAL''''n+6, which are portions of the data signal line DALn+6, intersect the data signal lines DALn and DALn+1 and the data signal line DALn+7 formed following the edge portion of the sparse pixel region MBR, in the present embodiment, the first wiring lines DAL'n+6, DAL"n+6, DAL'''n+6, and DAL''''n+6 of the data signal line DALn+6 and the portions of the data signal line DALn+6 other than the first wiring lines DAL'n+6, DAL"n+6, DAL'''n+6, and DAL''''n+6 are formed in different layers. For example, the first wiring lines DAL'n+6, DAL"n+6, DAL''' n+6, and DAL''''n+6 of the data signal line DALn+6 can be formed in a wiring line layer different from the layer forming the gate electrode of the transistor TR illustrated in FIG. 3 and different from the layer forming the source electrode and the drain electrode of the transistor TR illustrated in FIG. 3, and the portions of the data signal line DALn+6 other than the first wiring lines DAL'n+6, DAL"n+ 6, DAL'''n+6, and DAL''''n+6 can be formed in the layer forming the source electrode and the drain electrode of the transistor TR illustrated in FIG. 3. Note that in a similar manner, the green subpixel GSP' provided in the lower central side of the sparse pixel region MBR is electrically connected to the data signal line DALn+6 formed following the edge portion of the sparse pixel region MBR via the first wiring line DAL'''n+6.

As indicated by a broken line F in FIG. 2, the subpixel circuit (third subpixel circuit) provided in the upper central side of the sparse pixel region MBR, specifically, the subpixel circuit relating to the red subpixel RSP', and the data signal line DALn+7 formed following the edge portion of the sparse pixel region MBR are electrically connected via the first wiring line DAL"n+7 including a portion formed in the X-direction XD, that is the extending direction of the scanning signal lines. Since the first wiring lines DAL'n+7, DAL"n+7, DAL'''n+7, and DAL''''n+7, which are portions of the data signal line DALn+7, intersect the data signal lines DALn and DALn+1, in the present embodiment, the first wiring lines DAL'n+7, DAL"n+7, DAL'''n+7, and DAL''''n+7 of the data signal line DALn+7 and the portions of the data signal line DALn+7 other than the first wiring lines DAL'n+7, DAL"n+7, DAL'''n+7, and DAL''''n+7 are formed in different layers. For example, the first wiring lines DAL'n+7, DAL"n+7, DAL'''n+7, and DAL''''n+7 of the data signal line DALn+7 can be formed in a wiring line layer different from the layer forming the gate electrode of the transistor TR illustrated in FIG. 3 and different from the layer forming the source electrode and the drain electrode of the transistor TR illustrated in FIG. 3, and the portions of the data signal line DALn+7 other than the first wiring lines DAL'n+7, DAL"n+7, DAL'''n+7, and DAL''''n+7 can be formed in the layer forming the source electrode and the drain electrode of the transistor TR illustrated in FIG. 3. Note that in a similar manner, the blue subpixel BSP' provided in the lower central side of the sparse pixel region MBR is electrically connected to the data signal line DALn+7 formed following the edge portion of the sparse pixel region MBR via the first wiring line DAL'''n+7.

As illustrated in FIG. 2, the data signal line DALn+2 (third data signal line) formed following the edge portion of the sparse pixel region MBR includes the first wiring lines DAL'n+2 and DAL"n+2 including a portion formed in the x-direction XD, that is the extending direction of the scanning signal lines. Since the first wiring lines DAL'n+2 and DAL"n+2, which are portions of the data signal line DALn+ 2, intersect the data signal lines DALn and DALn+1, in the present embodiment, the first wiring lines DAL'n+2 and DAL"n+2 of the data signal line DALn+2 and the portions of the data signal line DALn+2 other than the first wiring lines DAL'n+2 and DAL"n+2 are formed in different layers. For example, the first wiring lines DAL'n+2 and DAL"n+2 of the data signal line DALn+2 can be formed in a wiring line layer different from the layer forming the gate electrode of the transistor TR illustrated in FIG. 3 and different from the layer forming the source electrode and the drain electrode of the transistor TR illustrated in FIG. 3, and the portions of the data signal line DALn+2 other than the first wiring lines DAL'n+2 and DAL"n+2 can be formed in the layer forming the source electrode and the drain electrode of the transistor TR illustrated in FIG. 3.

The first wiring lines of the data signal line DALn+2, the first wiring lines of the data signal line DALn−6, the first wiring lines of the data signal line DALn−5, the first wiring lines of the data signal line DALn+6, and the first wiring lines of the data signal line DALn+7 described above preferably overlap a portion of the plurality of scanning signal lines that are not illustrated and are formed in the X-direction XD.

Figure 5:
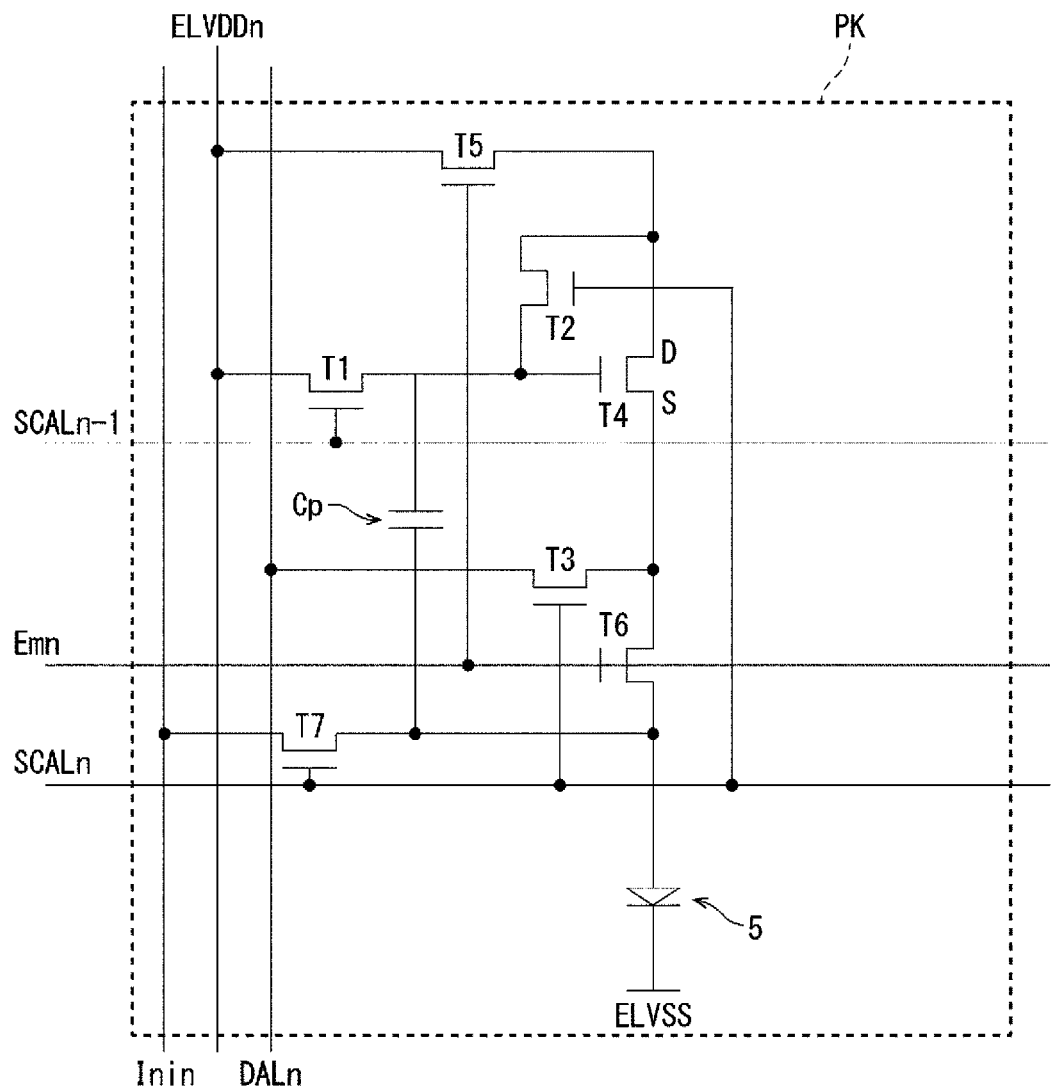
FIG. 5 is a schematic diagram illustrating an example configuration of a subpixel circuit provided in the display device according to the first embodiment.

FIG. 5 is a schematic diagram illustrating an example configuration of a subpixel circuit PK provided in the display device 1 according to the first embodiment. Note that the subpixel circuit PK illustrated is the (n,n)th subpixel circuit PK, but also includes a part of the (n−1,n)th subpixel circuit PK.

The subpixel circuit PK illustrated in FIG. 5 includes: a capacitance element Cp; a first initialization transistor T1 connected between a high power supply voltage line ELVDDn and a control terminal of a drive transistor T4 and including a gate terminal connected to a scanning signal line SCALn−1 of the preceding stage ((n−1)th stage); a threshold control transistor T2 connected between a drain region D and the control terminal of the drive transistor T4 and including a gate terminal connected to a scanning signal line SCALn of its own stage (nth stage); a writing control transistor T3 connected between the data signal line DALn and a source region S of the drive transistor T4 and including a gate terminal connected to the scanning signal line SCALn of its own stage (nth stage); the drive transistor T4 configured to control a current of the light-emitting element 5; a power supply transistor T5 connected between the high power supply voltage line ELVDDn and the drain region D of the drive transistor T4 and including a gate terminal connected to a light-emission control line Emn; a light emission control transistor T6 connected between the source region S of the drive transistor T4 and the anode electrode 22 of the light-emitting element 5 and including a gate terminal connected to the light emission control line Emn;

and a second initialization transistor T7 connected between a second initialization power source line Inin and the anode electrode 22 of the light-emitting element 5 and including a gate terminal connected to the scanning signal line SCALn of its own stage (nth stage).

The subpixel circuit PK illustrated in FIG. 5 includes the data signal line DALn and the high power supply voltage line ELVDDn on the left side of the arrangement positions of the transistors T1 to T7.

Figure 6:
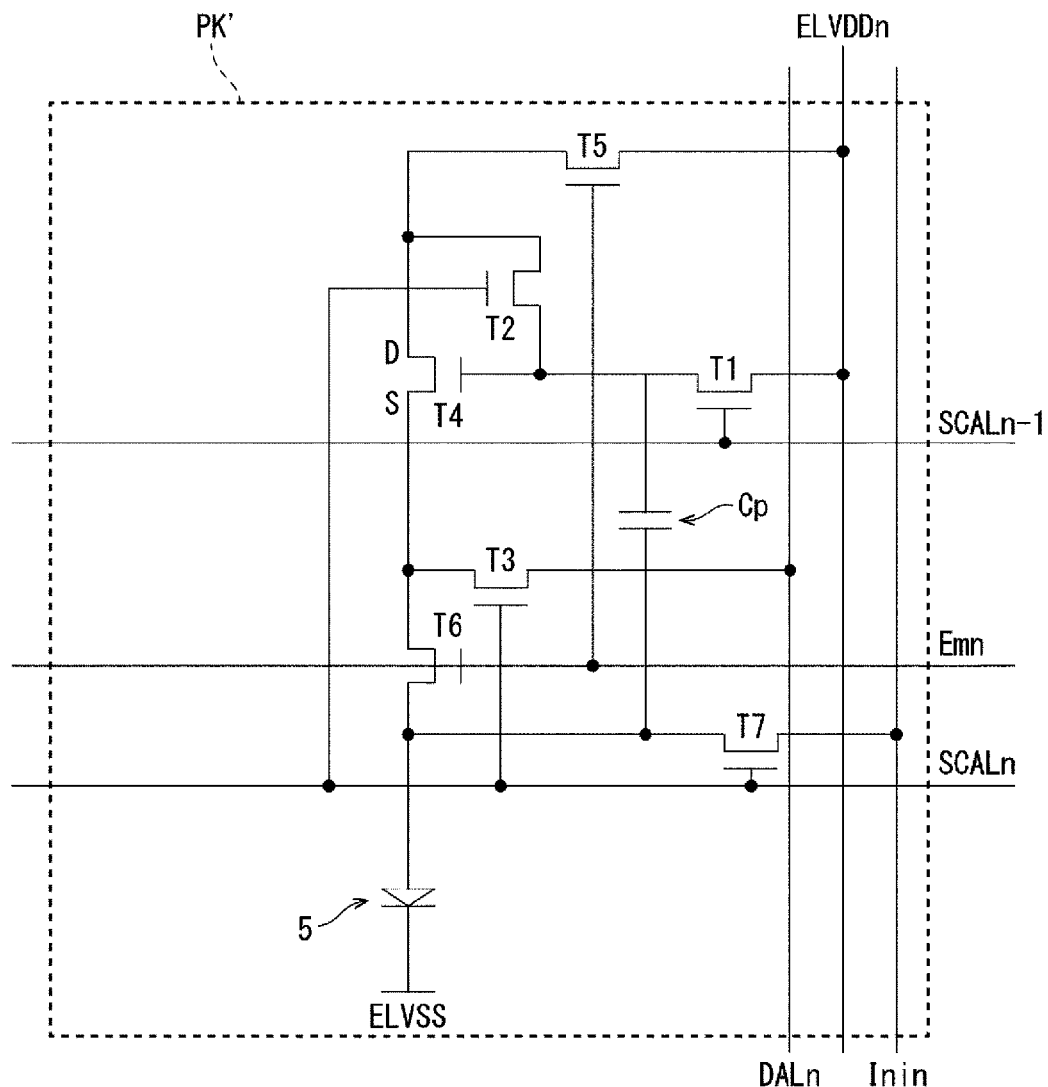
FIG. 6 is a schematic diagram illustrating an example configuration of another subpixel circuit provided in the display device according to the first embodiment.

FIG. 6 is a schematic diagram illustrating an example configuration of another subpixel circuit PK' provided in the display device 1 according to the first embodiment.

The subpixel circuit PK' illustrated in FIG. 6 includes the data signal line DALn and the high power supply voltage line ELVDDn on the right side of the arrangement positions of the transistors T1 to T7, and in this manner differs from the subpixel circuit PK illustrated in FIG. 5.

The subpixel circuit PK (first subpixel circuit) illustrated in FIG. 5 and the subpixel circuit PK' (second subpixel circuit) illustrated in FIG. 6 are symmetrically disposed with respect to an axis of symmetry corresponding to the extending direction (Y-direction YD in FIG. 1 and FIG. 2) of the data signal lines provided in the display region DA. That is, the subpixel circuit PK (first subpixel circuit) illustrated in FIG. 5 and the subpixel circuit PK' (second subpixel circuit) illustrated in FIG. 6 have left-right symmetry.

As indicated by a broken line H in FIG. 2, the data signal line DALn (first data signal line), which is one of the plurality of data signal lines provided in the display region DA, is also formed in the sparse pixel region MBR in the extending direction (Y-direction YD in FIG. 2) of the data signal lines provided in the display region DA. The data signal line DALn+1 (second data signal line), which is one of the plurality of data signal lines provided in the display region DA and most adjacent to the data signal line DALn (first data signal line), is also formed in the sparse pixel region MBR in the extending direction (Y-direction YD in FIG. 2) of the data signal lines provided in the display region DA.

As indicated by the broken line H in FIG. 2, the subpixel circuit (first subpixel circuit) provided in the upper central side of the sparse pixel region MBR and the data signal line DALn (first data signal line) are electrically connected. Specifically, the subpixel circuit relating to the green subpixel GSP' and the data signal line DALn (first data signal line) are electrically connected. Also, the subpixel circuit (second subpixel circuit) provided in the upper central side of the sparse pixel region MBR and the data signal line DALn+1 (second data signal line) are electrically connected. Specifically, the subpixel circuit relating to the blue subpixel BSP' and the data signal line DALn+1 (second data signal line) are electrically connected. In a similar manner, the subpixel circuit (first subpixel circuit) provided in the lower central side of the sparse pixel region MBR and the data signal line DALn (first data signal line) are electrically connected. Specifically, the subpixel circuit relating to the green subpixel GSP' and the data signal line DALn (first data signal line) are electrically connected. Also, the subpixel circuit (second subpixel circuit) provided in the lower central side of the sparse pixel region MBR and the data signal line DALn+1 (second data signal line) are electrically connected. Specifically, the subpixel circuit relating to the red subpixel RSP' and the data signal line DALn+1 (second data signal line) are electrically connected.

Figure 7:
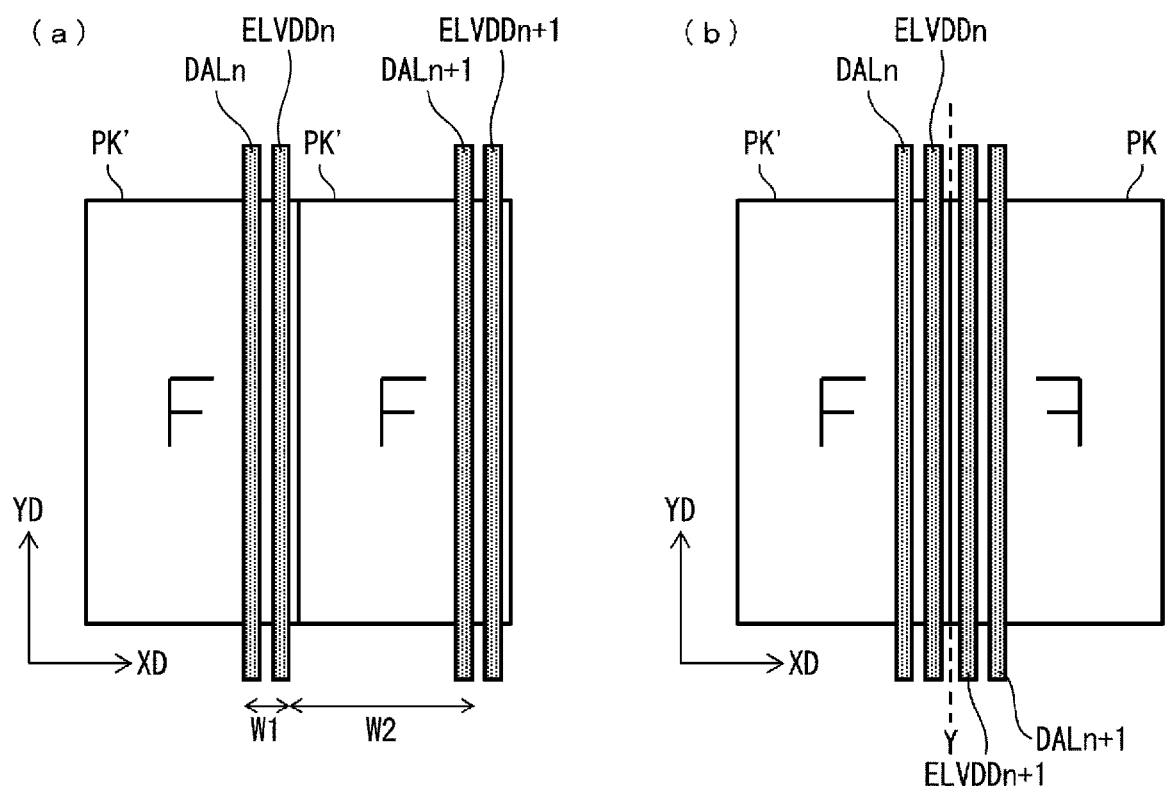
FIG. 7(a) is a diagram illustrating a case in which two of the subpixel circuits illustrated in FIG. 6 are provided and data signal lines and high power supply voltage lines do not overlap in a plan view.
FIG. 7(b) is a diagram illustrating a case in which the subpixel circuit illustrated in FIG. 5 and the subpixel circuits illustrated in FIG. 6 are provided and the data signal lines and the high power supply voltage lines do not overlap in a plan view.

(a) of FIG. 7 is a diagram illustrating a case in which two of the subpixel circuits PK' illustrated in FIG. 6 are provided and the data signal lines DALn and DALn+1 and the high power supply voltage lines ELVDDn and ELVDDn+1 do not overlap in a plan view. (b) of FIG. 7 is a diagram illustrating a case in which the subpixel circuit PK illustrated in FIG. 5 and the subpixel circuits PK' illustrated in FIG. 6 are provided and the data signal lines DALn and DALn+1 and the high power supply voltage lines ELVDDn and ELVDDn+1 do not overlap in a plan view.

In a case in which, as described above, the data signal line DALn (first data signal line), which is one of the plurality of data signal lines provided in the display region DA, and the data signal line DALn+1 (second data signal line), which is one of the plurality of data signal lines provided in the display region DA and most adjacent to the data signal line DALn (first data signal line), are also formed in the sparse pixel region MBR in the extending direction (Y-direction YD in FIG. 2) of the data signal lines provided in the display region DA, the following points are preferably taken into account.

As illustrated in (a) of FIG. 7, in the case of a configuration provided with two of the subpixel circuits PK' illustrated in FIG. 6 (or a configuration provided with two of the subpixel circuits PK illustrated in FIG. 5), a wiring line pitch W1 between the data signal line DALn and the high power supply voltage line ELVDDn and the wiring line pitch W1 between the data signal line DALn+1 and the high power supply voltage line ELVDDn+1 are approximately a few µm, and a pixel pitch W2 between the high power supply voltage line ELVDDn and the data signal line DALn+1 is approximately a few tens of µm. Thus, as illustrated in (a) of FIG. 7, in the case of a configuration provided with two of the subpixel circuits PK' (or a configuration provided with two of the subpixel circuits PK illustrated in FIG. 5), diffraction light is caused by the wiring line pitch W1 and the pixel pitch W2. Accordingly, the amount of light from a subject guided to the light receiving unit of a camera CM through the sparse pixel region MBR is reduced.

As illustrated in (b) of FIG. 7, in the case of a configuration provided with the subpixel circuit PK illustrated in FIG. 5 and the subpixel circuit PK' illustrated in FIG. 6 symmetrically disposed with respect to an axis of symmetry Y corresponding to the extending direction (Y-direction YD) of the data signal lines provided in the display region DA, the pixel pitch W2 illustrated in (a) of FIG. 7 is approximately doubled and the occurrence of diffraction light caused by the pixel pitch W2 is suppressed. Accordingly, the diffraction effect when light from a subject is guided to the light receiving unit of the camera CM through the sparse pixel region MBR can be reduced.

With the configuration illustrated in (b) of FIG. 7, as illustrated in FIG. 2, the pitch between the data signal line DALn and the data signal line DALn+1 provided in the sparse pixel region MBR can be made smaller than the pitch between adjacent data signal lines provided in the display region DA.

Figure 8:
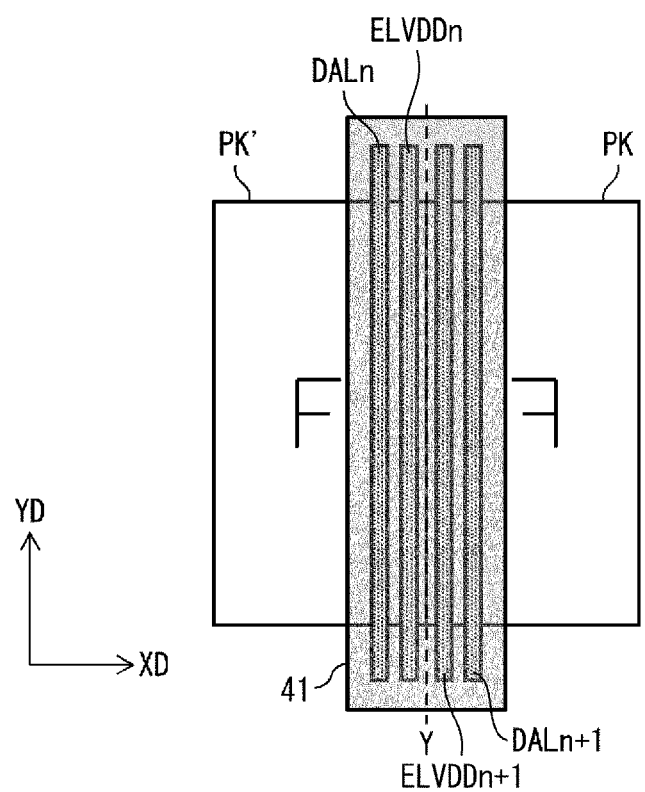
FIG. 8 is a diagram illustrating a case in which a light blocking layer is formed above the data signal lines and the high power supply voltage lines illustrated in (b) of FIG. 7.

FIG. 8 is a diagram illustrating a case in which a light blocking layer 41 is formed above the data signal lines DALn and DALn+1 and the high power supply voltage lines ELVDDn and ELVDDn+1 illustrated in (b) of FIG. 7.

As illustrated in FIG. 8, by providing the light blocking layer 41 above the data signal lines DALn and DALn+1 and the high power supply voltage lines ELVDDn and ELVDDn+1, the occurrence of diffraction light caused by the wiring line pitch W1 between the data signal line DALn and the high power supply voltage line ELVDDn, the wiring line pitch W1 between the data signal line DALn+1 and the high power supply voltage line ELVDDn+1, and the wiring line pitch between the high power supply voltage line ELVDDn and the data signal line DALn+1 can be suppressed. Accordingly, the diffraction effect when light from a subject is guided to the light receiving unit of the camera CM through the sparse pixel region MBR can be reduced. Since the pitch of the light blocking layer 41 corresponds to the pitch (approximately a few hundreds of μm) between the subpixels provided in the sparse pixel region MBR, making it far from the visible light wavelength, the diffraction light caused by the effects of the pitch of the light blocking layer 41 is greatly reduced. In this manner, when the light blocking layer 41 is provided, a decrease in transmittance can be further reduced.

The light blocking layer 41 is not particularly limited as long as the light blocking layer 41 can block visible light. However, the light blocking layer 41 is preferably formed of the material forming the anode 22 or the cathode 25 formed of an electrode material that reflects visible light. In this manner, the anode 22 or the cathode 25 and the light blocking layer 41 can be formed with a single process.

Also, as indicated by a broken line I in FIG. 2, the light blocking layer 41 is preferably formed above at least a portion of the wiring lines formed in the sparse pixel region MBR. With such a configuration, the occurrence of diffraction light caused by the wiring line pitch between the wiring lines formed in the sparse pixel region MBR can be suppressed. Accordingly, the diffraction effect when light from a subject is guided to the light receiving unit of the camera CM through the sparse pixel region MBR can be reduced.

As indicated by a broken line E in FIG. 2, the data signal line DALn+12 (first data signal line), which is one of the plurality of data signal lines provided in the display region DA, and the data signal line DALn+13 (second data signal line), which is one of the plurality of data signal lines provided in the display region DA and most adjacent to the data signal line DALn+12 (first data signal line), are formed in the sparse pixel region MBR in the extending direction (Y-direction YD in FIG. 2) of the data signal lines provided in the display region DA.

In the sparse pixel region MBR, the data signal line DALn+12 (first data signal line) and the data signal line DALn+13 (second data signal line) are preferably formed in different layers. For example, in the sparse pixel region MBR, the data signal line DALn+12 (first data signal line) can be formed in the layer forming the source electrode and the drain electrode of the transistor TR illustrated in FIG. 3, and the data signal line DALn+13 (second data signal line), specifically a portion DAL'n+13 of the data signal line DALn+13, can be formed in a wiring line layer different from the layer forming the gate electrode of the transistor TR illustrated in FIG. 3 and different from the layer forming the source electrode and the drain electrode of the transistor TR illustrated in FIG. 3.

Figure 9:
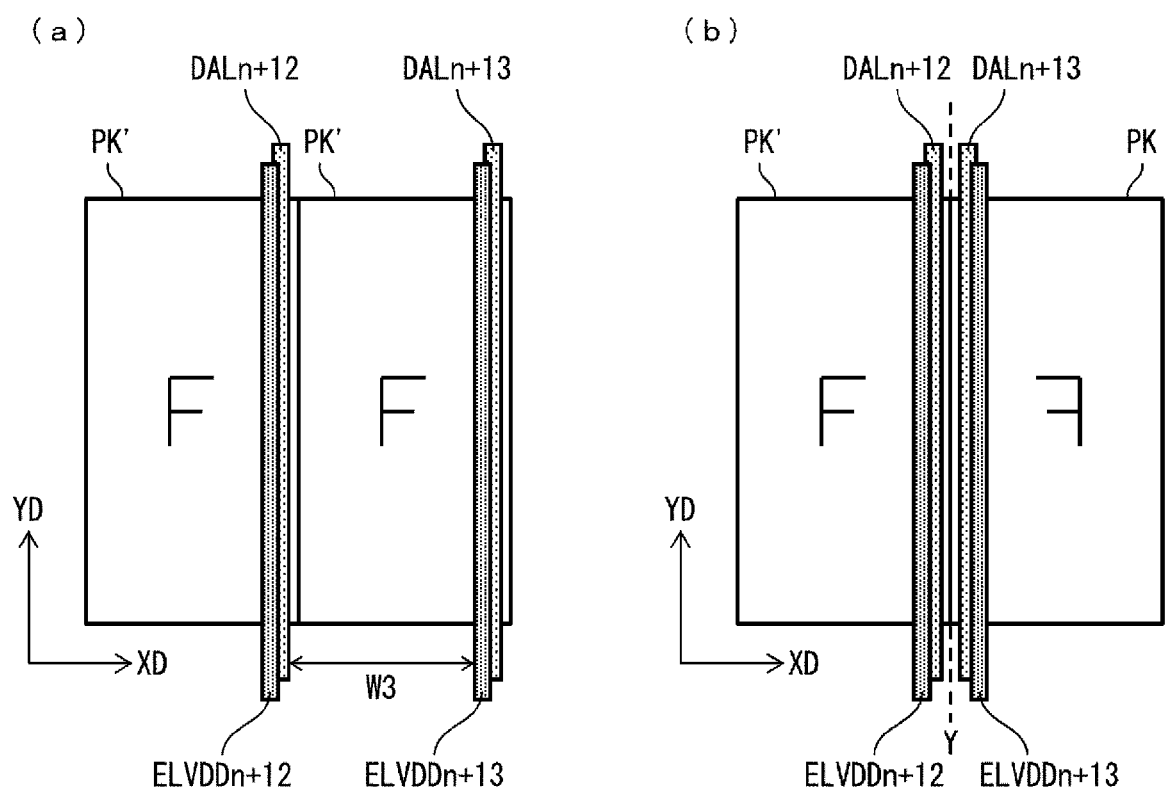
FIG. 9(a) is a diagram illustrating a case in which two of the subpixel circuits illustrated in FIG. 6 are provided and data signal lines and high power supply voltage lines overlap in a plan view.
FIG. 9(b) is a diagram illustrating a case in which the subpixel circuit illustrated in FIG. 5 and the subpixel circuits illustrated in FIG. 6 are provided and the data signal lines and the high power supply voltage lines overlap in a plan view.

(a) of FIG. 9 is a diagram illustrating a case in which two of the subpixel circuits PK' illustrated in FIG. 6 are provided and the data signal lines DALn+12 and DALn+13 and the high power supply voltage lines ELVDDn+12 and ELVDDn+13 overlap in a plan view. (b) of FIG. 9 is a diagram illustrating a case in which the subpixel circuit PK illustrated in FIG. 5 and the subpixel circuits PK' illustrated in FIG. 6 are provided and the data signal lines DALn+12 and DALn+13 and the high power supply voltage lines ELVDDn+12 and ELVDDn+13 overlap in a plan view. For example, in the sparse pixel region MBR, the data signal lines DALn+12 and DALn+13 can be formed in the layer forming the source electrode and the drain electrode of the transistor TR illustrated in FIG. 3, and the high power supply voltage lines ELVDDn+12 and ELVDDn+13 can be formed in a wiring line layer different from the layer forming the gate electrode of the transistor TR illustrated in FIG. 3 and different from the layer forming the source electrode and the drain electrode of the transistor TR illustrated in FIG. 3.

As illustrated in (a) of FIG. 9, in the case of a configuration provided with two of the subpixel circuits PK' illustrated in FIG. 6 (or a configuration provided with two of the subpixel circuits PK illustrated in FIG. 5), a pixel pitch W3 between a first wiring line region where the data signal line DALn+12 and the high power supply voltage line ELVDDn+12 overlap in a plan view and a second wiring line region where the data signal line DALn+13 and the high power supply voltage line ELVDDn+13 overlap in a plan view is approximately a few tens of μm. Thus, as illustrated in (a) of FIG. 9, in the case of a configuration provided with two of the subpixel circuits PK' (or a configuration provided with two of the subpixel circuits PK illustrated in FIG. 5), diffraction light is caused by the pixel pitch W3. Accordingly, the spectrally separated light (light colored by a diffraction effect) from a subject is guided to the light receiving unit of the camera CM through the sparse pixel region MBR.

As illustrated in (b) of FIG. 9, in the case of a configuration provided with the subpixel circuit PK illustrated in FIG. 5 and the subpixel circuit PK' illustrated in FIG. 6 symmetrically disposed with respect to an axis of symmetry Y corresponding to the extending direction (Y-direction YD) of the data signal lines provided in the display region DA, the pixel pitch W3 illustrated in (a) of FIG. 9 is approximately doubled and the occurrence of diffraction light caused by the pixel pitch W3 is suppressed. Accordingly, the diffraction effect when light from a subject is guided to the light receiving unit of the camera CM through the sparse pixel region MBR can be reduced.

With the configuration illustrated in (b) of FIG. 9, as illustrated in FIG. 2, the pitch between the data signal line DALn+12 and the data signal line DALn+13 provided in the sparse pixel region MBR can be made smaller than the pitch between adjacent data signal lines provided in the display region DA.

Figure 10:
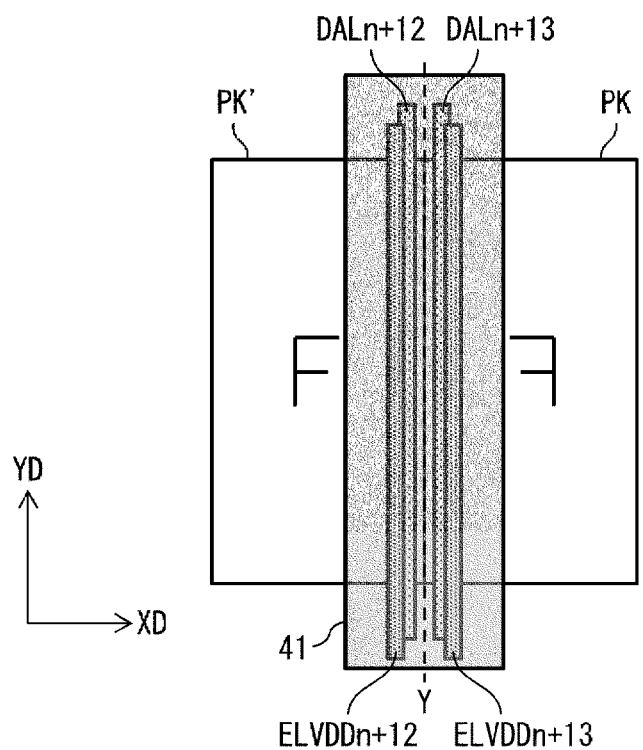
FIG. 10 is a diagram illustrating a case in which the light blocking layer is formed above the data signal lines and the high power supply voltage lines illustrated in (b) of FIG. 9.

FIG. 10 is a diagram illustrating a case in which the light blocking layer 41 is formed above the data signal lines DALn+12 and DALn+13 and the high power supply voltage lines ELVDDn+12 and ELVDDn+13 illustrated in (b) of FIG. 9.

As illustrated in FIG. 10, by providing the light blocking layer 41 above the data signal lines DALn+12 and DALn+13 and the high power supply voltage lines ELVDDn+12 and ELVDDn+13, the occurrence of diffraction light caused by the wiring line pitch between the first wiring line region where the data signal line DALn+12 and the high power supply voltage line ELVDDn+12 illustrated in (b) of FIG. 9 overlap in a plan view and the second wiring line region where the data signal line DALn+13 and the high power supply voltage line ELVDDn+13 overlap in a plan view can be suppressed. Accordingly, the diffraction effect when light from a subject is guided to the light receiving unit of the camera CM through the sparse pixel region MBR can be reduced. In this manner, when the light blocking layer 41 is provided, a decrease in transmittance can be further reduced.

Figure 11:
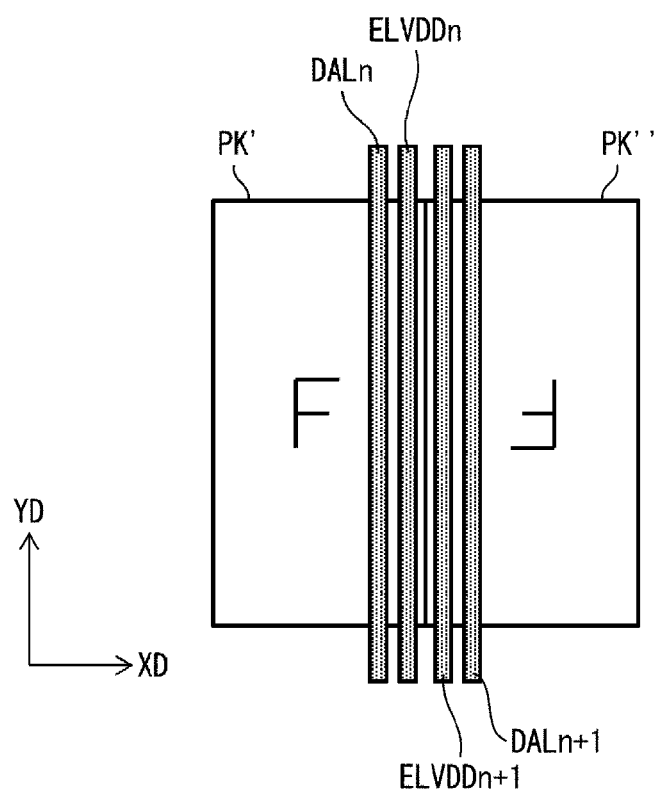
FIG. 11 is a diagram illustrating a case in which the subpixel circuit illustrated in FIG. 6 and the subpixel circuit illustrated in FIG. 12 are provided, and the data signal lines and the high power supply voltage lines do not overlap in a plan view.
Figure 12:
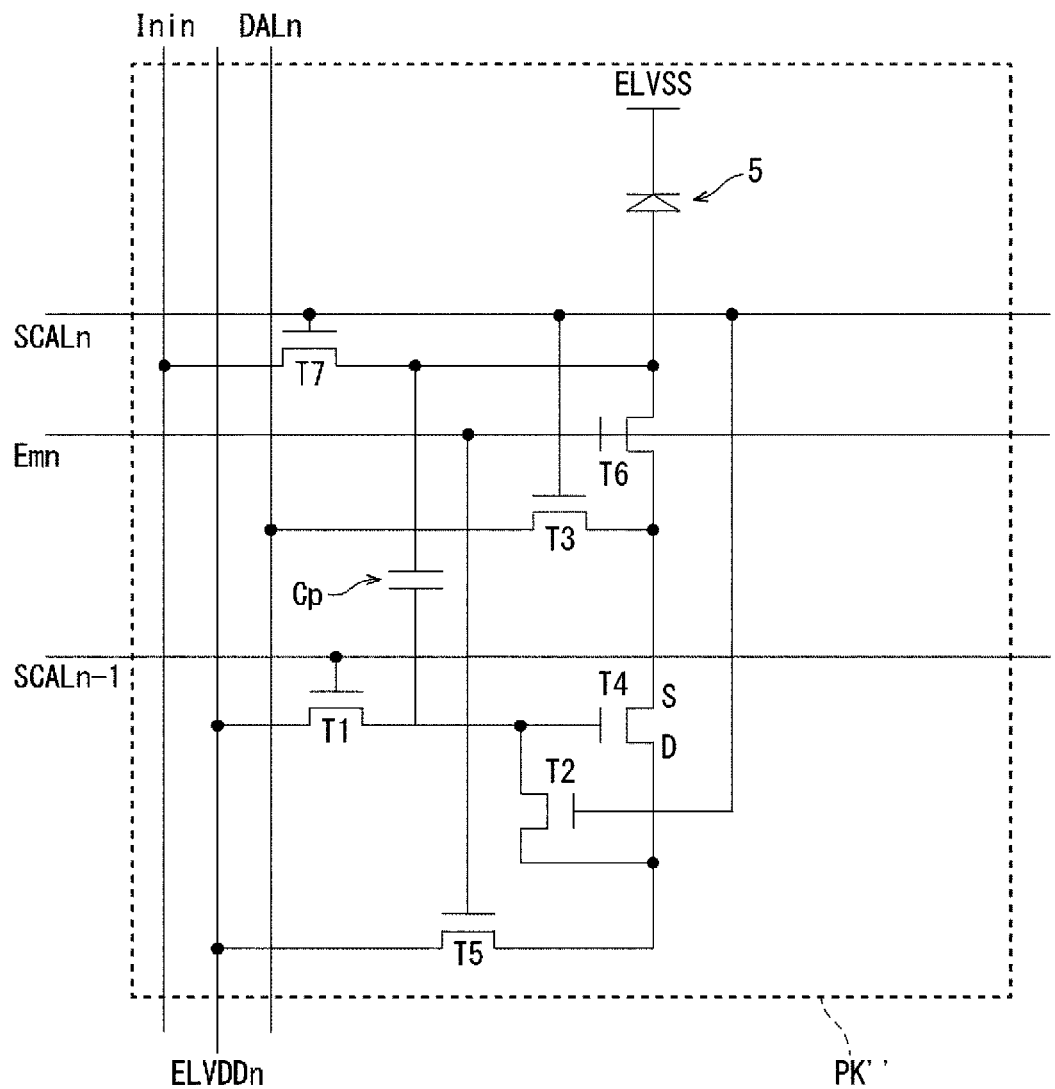
FIG. 12 is a schematic diagram illustrating an example configuration of another subpixel circuit provided in the display device according to the first embodiment.

FIG. 11 is a diagram illustrating a case in which, instead of the subpixel circuits PK' illustrated in FIG. 6 and the subpixel circuit PK illustrated in FIG. 5, a subpixel circuit PK'' illustrated in FIG. 12 is provided, and the data signal lines DALn and DALn+1 and the high power supply voltage lines ELVDDn and ELVDDn+1 do not overlap in a plan view.

FIG. 12 is a schematic diagram illustrating an example configuration of another subpixel circuit PK" provided in the display device according to the first embodiment.

The subpixel circuit PK" illustrated in FIG. 12 includes the data signal line DALn and the high power supply voltage line ELVDDn on the left side of the arrangement positions of the transistors T1 to T7 and includes the scanning signal line SCALn and the scanning signal line SCALn−1 disposed in this order from the upper side, and in this manner differs from the subpixel circuit PK' illustrated in FIG. 6.

When the subpixel circuit PK' (first subpixel circuit) illustrated in FIG. 6 is inverted 180° on the plane, the subpixel circuit PK' coincides with the subpixel circuit PK" (second subpixel circuit) illustrated in FIG. 12.

As illustrated in FIG. 11, in the case of a configuration provided with the subpixel circuit PK' illustrated in FIG. 6 and the subpixel circuit PK" illustrated in FIG. 12, the pixel pitch W2 illustrated in (a) of FIG. 7 is not provided and the occurrence of diffraction light caused by the pixel pitch W2 is suppressed. Accordingly, the diffraction effect when light from a subject is guided to the light receiving unit of the camera CM through the sparse pixel region MBR can be reduced.

With the configuration illustrated in FIG. 11, as illustrated in FIG. 2, the pitch between the data signal line DALn and the data signal line DALn+1 provided in the sparse pixel region MBR can be made smaller than the pitch between adjacent data signal lines provided in the display region DA.

Figure 13:
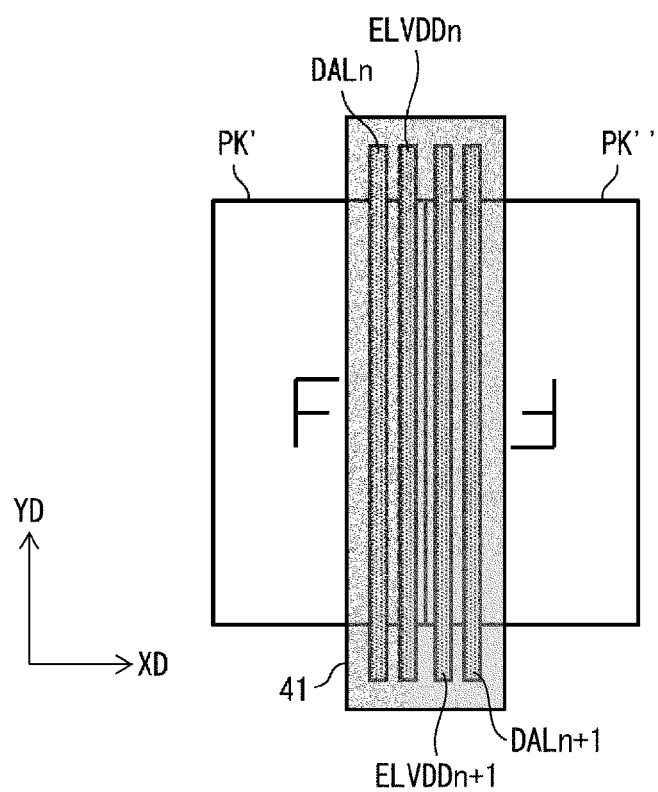
FIG. 13 is a diagram illustrating a case in which the light blocking layer is formed above the data signal lines and the high power supply voltage lines illustrated in FIG. 11.

FIG. 13 is a diagram illustrating a case in which the light blocking layer 41 is formed above the data signal lines DALn and DALn+1 and the high power supply voltage lines ELVDDn and ELVDDn+1 illustrated in FIG. 11.

As illustrated in FIG. 13, by providing the light blocking layer 41 above the data signal lines DALn and DALn+1 and the high power supply voltage lines ELVDDn and ELVDDn+1, the occurrence of diffraction light caused by the wiring line pitch W1 between the data signal line DALn and the high power supply voltage line ELVDDn, the wiring line pitch W1 between the data signal line DALn+1 and the high power supply voltage line ELVDDn+1, and the wiring line pitch between the high power supply voltage line ELVDDn and the data signal line DALn+1 can be suppressed. Accordingly, the diffraction effect when light from a subject is guided to the light receiving unit of the camera CM through the sparse pixel region MBR can be reduced. Since the pitch of the light blocking layer 41 corresponds to the pitch (approximately a few hundreds of μm) between the subpixels provided in the sparse pixel region MBR, making it far from the visible light wavelength, the diffraction light caused by the effects of the pitch of the light blocking layer 41 is greatly reduced. In this manner, when the light blocking layer 41 is provided, a decrease in transmittance can be further reduced.

Figure 14:
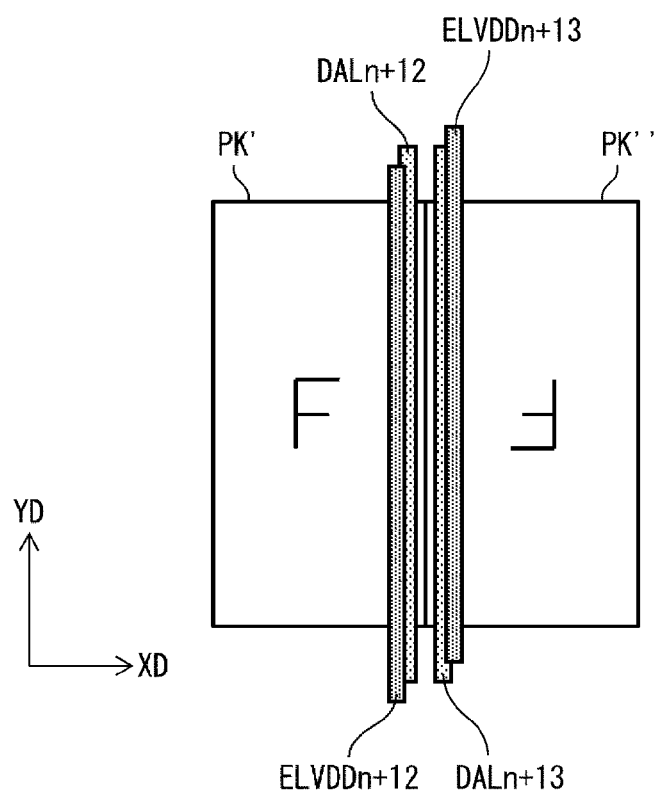
FIG. 14 is a diagram illustrating a case in which the subpixel circuit illustrated in FIG. 6 and the subpixel circuit illustrated in FIG. 12 are provided, and the data signal lines and the high power supply voltage lines overlap in a plan view.

FIG. 14 is a diagram illustrating a case in which, instead of the subpixel circuits PK' illustrated in FIG. 6 and the subpixel circuit PK illustrated in FIG. 5, the subpixel circuit PK" illustrated in FIG. 12 is provided, and the data signal lines DALn+12 and DALn+13 and the high power supply voltage lines ELVDDn+12 and ELVDDn+13 overlap in a plan view.

As illustrated in FIG. 14, in the case of a configuration provided with the subpixel circuit PK' illustrated in FIG. 6 and the subpixel circuit PK" illustrated in FIG. 12, the pixel pitch W3 (approximately a few tens of μm) between the first wiring line region where the data signal line DALn+12 and the high power supply voltage line ELVDDn+12 illustrated in (a) of FIG. 9 overlap in a plan view and the second wiring line region where the data signal line DALn+13 and the high power supply voltage line ELVDDn+13 overlap in a plan view is approximately doubled and the occurrence of diffraction light caused by the pixel pitch W3 can be suppressed. Accordingly, the diffraction effect when light from a subject is guided to the light receiving unit of the camera CM through the sparse pixel region MBR can be reduced.

With the configuration illustrated in FIG. 14, as illustrated in FIG. 2, the pitch between the data signal line DALn+12 and the data signal line DALn+13 provided in the sparse pixel region MBR can be made smaller than the pitch between adjacent data signal lines provided in the display region DA.

Figure 15:
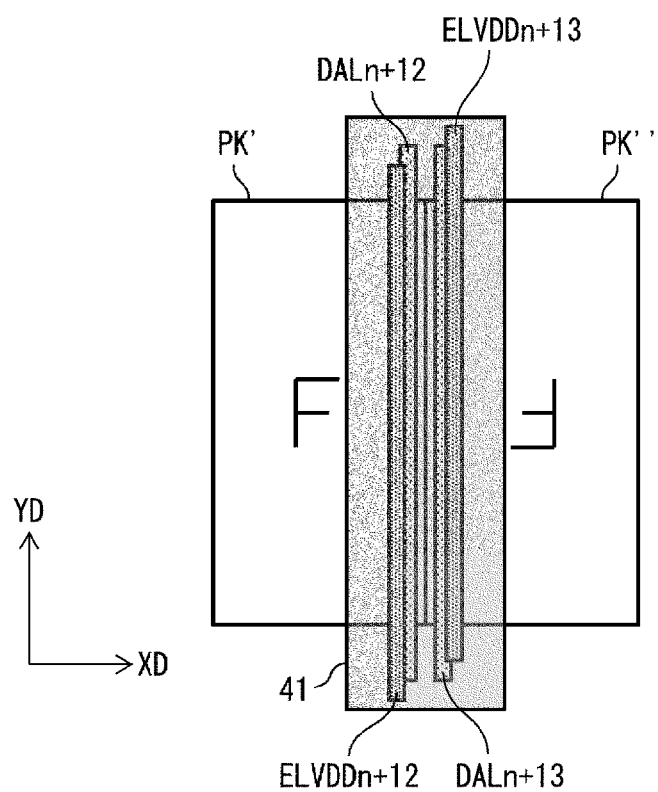
FIG. 15 is a diagram illustrating a case in which the light blocking layer is formed above the data signal lines and the high power supply voltage lines illustrated in FIG. 14.

FIG. 15 is a diagram illustrating a case in which the light blocking layer 41 is formed above the data signal lines DALn+12 and DALn+13 and the high power supply voltage lines ELVDDn+12 and ELVDDn+13 illustrated in FIG. 14.

As illustrated in FIG. 15, by providing the light blocking layer 41 above the data signal lines DALn+12 and DALn+13 and the high power supply voltage lines ELVDDn+12 and ELVDDn+13, the occurrence of diffraction light caused by the wiring line pitch between the first wiring line region where the data signal line DALn+12 and the high power supply voltage line ELVDDn+12 overlap in a plan view and the second wiring line region where the data signal line DALn+13 and the high power supply voltage line ELVDDn+13 overlap in a plan view can be suppressed. Accordingly, the diffraction effect when light from a subject is guided to the light receiving unit of the camera CM through the sparse pixel region MBR can be reduced. In this manner, when the light blocking layer 41 is provided, a decrease in transmittance can be further reduced.

In the example of the present embodiment described above, in the display region DA on the left side of the sparse pixel region MBR, the display region DA on the right side of the sparse pixel region MBR, and the sparse pixel region MBR, the plurality of scanning signal lines are linearly formed in the X-direction XD. However, no such limitation is intended, and, for example, in the display region DA on the left side of the sparse pixel region MBR, the display region DA on the right side of the sparse pixel region MBR, and the sparse pixel region MBR, the arrangement of the scanning signal lines according to the second embodiment described below may be used as appropriate.

Second Embodiment

Next, the second embodiment according to the disclosure will be described with reference to FIGS. 16 to 21. The display device of the present embodiment is different from the display device described in the first embodiment in that in the display region DA on the upper side of the sparse pixel region MBR, the display region DA on the lower side of the sparse pixel region MBR, and the sparse pixel region MBR, the plurality of data signal lines are linearly formed in the Y-direction YD. Other configurations are as described in the first embodiment. For convenience of explanation, components having the same functions as those described in diagrams of the first embodiment are denoted by the same reference numerals, and descriptions thereof will be omitted.

Figure 16:
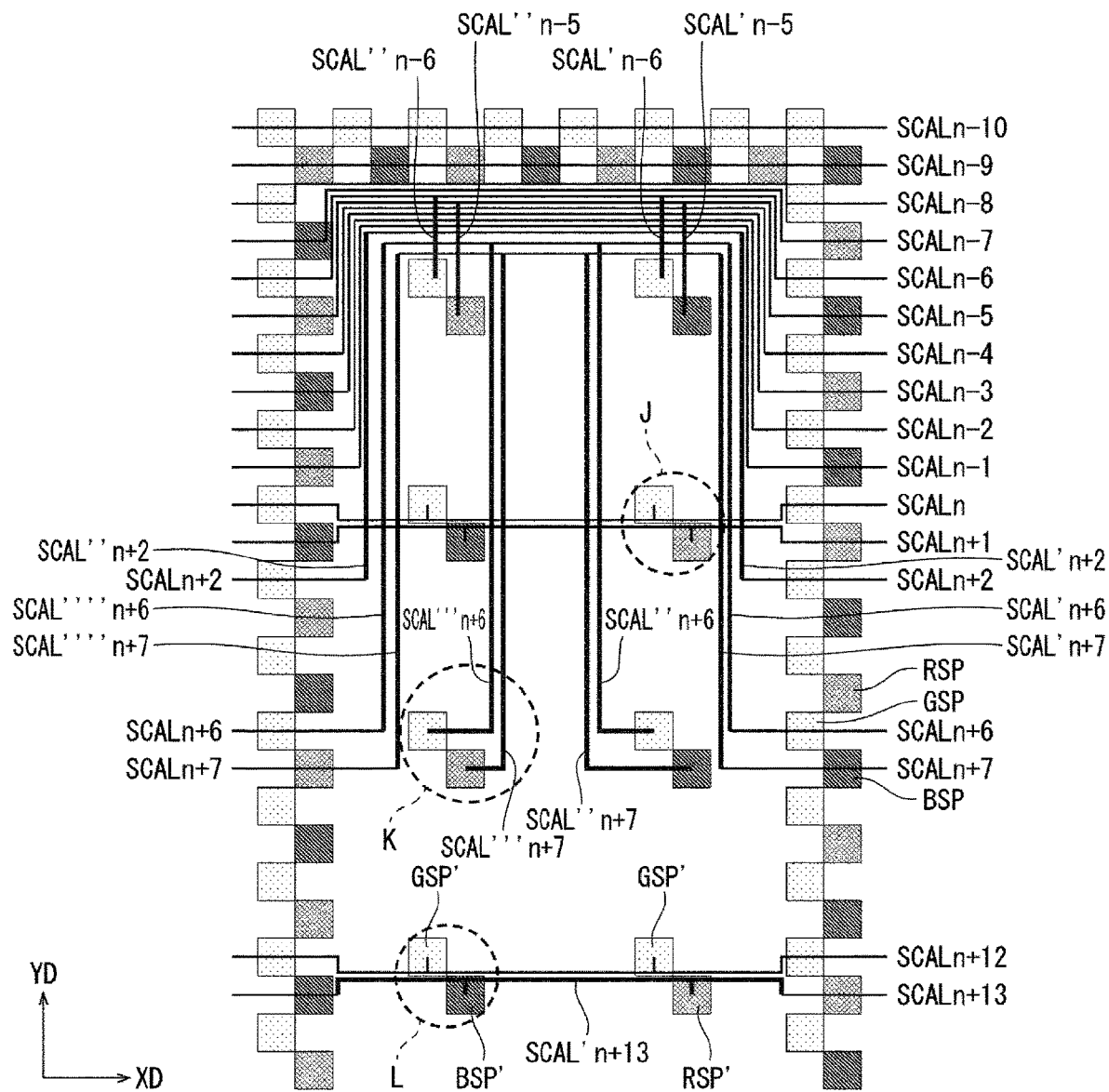
FIG. 16 is a partial enlarged view of the sparse pixel region of the display device according to a second embodiment.

FIG. 16 is a partial enlarged view of the sparse pixel region MBR of the display device according to the second embodiment.

Note that in FIG. 16, the plurality of data signal lines linearly formed in the display region DA and the sparse pixel region MBR are omitted from the diagram.

As illustrated in FIG. 16, in the display region DA, red subpixels RSP, green subpixels GSP, and blue subpixels BSP are disposed in a relatively high density. On the other hand, in the sparse pixel region MBR, the subpixels of each color are reduced in number, and red subpixels RSP', green subpixels GSP', and blue subpixels BSP' are disposed in a relatively low density.

As illustrated in FIG. 16, the scanning signal line SCALn−9 and the scanning signal line SCALn−10 (n is a natural number equal to or greater than 11) are examples of the scanning signal lines provided in the display region DA where the sparse pixel region MBR has no effect. The scanning signal line SCALn−9 and the scanning signal line SCALn−10 are linearly formed in the X-direction XD from the left end of the display region DA to the right end.

As illustrated in FIG. 16, the sparse pixel region MBR includes the no-pixel region not including the subpixel circuit in one entire line in the X-direction XD, that is the extending direction of the scanning signal lines provided in the display region DA, or in the Y-direction YD, that is the extending direction of the data signal lines provided in the display region DA (in the present embodiment, the sparse pixel region MBR of the display device includes a no-pixel region not including the subpixel circuit in one entire line in the X-direction XD, that is the extending direction of the scanning signal lines provided in the display region DA).

As illustrated in FIG. 16, for example, each one of the scanning signal lines SCALn+2, SCALn−1 to SCALn−4, SCALn−7, and SCALn−8 (third scanning signal lines) corresponds to, in the sparse pixel region MBR, the no-pixel region not including the subpixel circuit in one entire line in the X-direction XD, that is the extending direction of these scanning signal lines provided in the display region DA.

Since the red subpixels RSP', the green subpixels GSP', and the blue subpixels BSP' are formed in the no-pixel region of the sparse pixel region MBR, the light-emitting element 5 does not also need to be formed, and control circuit including the transistor TR for controlling the light-emitting element 5 also does not need to be formed. Accordingly, in the no-pixel region of the sparse pixel region MBR, a subpixel circuit including the control circuit including the transistor TR and the light-emitting element 5 is not formed.

As illustrated in FIG. 16, in the display device according to the present embodiment, the average density (number of the subpixel circuits provided in the display region DA/area of the display region DA) of the subpixel circuits provided in the display region DA is greater than the average density (number of the subpixel circuits provided in the sparse pixel region MBR/area of the sparse pixel region MBR) of the subpixel circuits provided in the sparse pixel region MBR.

As described above, since the display device according to the present embodiment includes the red subpixels RSP', the green subpixels GSP', and the blue subpixels BSP' in the sparse pixel region MBR, a display can be performed in the sparse pixel region MBR. The sparse pixel region MBR of the display device of the present embodiment includes the no-pixel region not including the subpixel circuit in one entire line in the X-direction XD, that is the extending direction of the scanning signal lines provided in the display region DA or the Y-direction YD, that is the extending direction of the data signal lines provided in the display region DA. Accordingly, in the no-pixel region of the sparse pixel region MBR, the scanning signal lines may not be formed, and the plurality of scanning signal lines can be collectively formed. Thus, in the sparse pixel region MBR of the display device according to the present embodiment, the occurrence of diffraction light caused by the effects of the wiring line pitch of the plurality of scanning signal lines linearly formed at a certain interval can be suppressed, and transmittance of the sparse pixel region MBR can be improved and coloring can be reduced.

However, in the present embodiment, as described above, in the sparse pixel region MBR as in the display region DA, the plurality of data signal lines are linearly formed in the Y-direction YD. However, as illustrated in FIG. 16, for example, each one of the scanning signal lines SCALn+7, SCALn+6, SCALn+2, SCALn−1 to SCALn−8 (third scanning signal lines) is not linearly formed in the X-direction XD, that is the extending direction of the scanning signal lines provided in the display region DA, in the sparse pixel region MBR.

As illustrated in FIG. 16, each one of the scanning signal lines SCALn+7, SCALn+6, SCALn+2, SCALn−1 to SCALn−8 (third scanning signal lines) is formed following the edge portion of the sparse pixel region MBR in the sparse pixel region MBR. On the other hand, in the display region DA of the left side of the sparse pixel region MBR, each one of the scanning signal lines SCALn+7, SCALn+6, SCALn+2, SCALn−1 to SCALn−8 is linearly formed in the X-direction XD from the left end of the display region DA to the right end of the sparse pixel region MBR, and in the display region DA on the right side of the sparse pixel region MBR, each one of the scanning signal lines SCALn+7, SCALn+6, SCALn+2, SCALn−1 to SCALn−8 (third scanning signal lines) is linearly formed in the X-direction XD from the right end of the display region DA to the left end of the sparse pixel region MBR.

In the present embodiment, all of the scanning signal lines are formed, in the display region DA, in the same layer, that is, the layer forming the gate electrode of the transistor TR illustrated in FIG. 3. Each one of the scanning signal lines SCALn and SCALn+1 is formed, in the sparse pixel region MBR also, in the same layer as the display region DA, that is, the layer forming the gate electrode of the transistor TR illustrated in FIG. 3. For example, second wiring lines SCAL'n−5, SCAL"n−5, SCAL'n−6, SCAL"n−6, SCAL'n+2, SCAL"n+2, SCAL'n+6 to SCAL""n+6, and SCAL'n+7 to SCAL""n+7 (all indicated in FIG. 16 by a thick line), which are portions of the scanning signal lines SCALn−5, SCALn−6, SCALn+2, SCALn+6, and SCALn+7 (third scanning signal lines), from among the scanning signal lines SCALn+7, SCALn+6, SCALn+2, SCALn−1 to SCALn−8 formed following the edge portion of the sparse pixel region MBR, that in the sparse pixel region MBR include a portion formed in the Y-direction YD, that is the extending direction of the data signal lines, or in other words, a portion of the scanning signal lines SCALn−5, SCALn−6, SCALn+2, SCALn+6, and SCALn+7 in the sparse pixel region MBR, are formed in a wiring line layer different from the layer forming the gate electrode of the transistor TR illustrated in FIG. 3 and different from the layer forming the source electrode and the drain electrode of the transistor TR illustrated in FIG. 3.

In particular, in the sparse pixel region MBR, the scanning signal lines SCALn+2, SCALn+6, and SCALn+7 intersect the scanning signal lines SCALn and SCALn+1. Thus, with the configuration described above, insulating properties can be ensured between the scanning signal lines SCALn+2, SCALn+6, and SCALn+7 and the scanning signal lines SCALn and SCALn+1. Also, in the sparse pixel region MBR, the scanning signal lines SCALn−5 and SCALn−6 intersect the other scanning signal lines. Thus, with the configuration described above, insulating properties can be ensured between the scanning signal lines SCALn−5 and SCALn−6 and the other scanning signal lines.

In the present embodiment, the second wiring lines, that is a portion, in the sparse pixel region MBR, of the scanning signal lines SCALn−5, SCALn−6, SCALn+2, SCALn+6, and SCALn+7 that intersect other scanning signal lines are formed in a wiring line layer different from the layer forming the gate electrode of the transistor TR illustrated in FIG. 3 and different from the layer forming the source electrode and the drain electrode of the transistor TR illustrated in FIG. 3. However, no such limitation is intended. For example, the second wiring lines, that is a portion, in the sparse pixel region MBR, of the scanning signal lines SCALn−1 to SCALn−8, SCALn+2, SCALn+6, and SCALn+7 including a portion formed in the Y-direction YD, that is the extending direction of the data signal lines, may be formed in a wiring line layer different from the layer forming the gate electrode of the transistor TR illustrated in FIG. 3 and different from the layer forming the source electrode and the drain electrode of the transistor TR illustrated in FIG. 3.

The portion, in the sparse pixel region MBR, of the scanning signal lines SCALn−5, SCALn−6, SCALn+2, SCALn+6, and SCALn+7 described above that is formed in a wiring line layer different from the layer forming the gate electrode of the transistor TR illustrated in FIG. 3 and different from the layer forming the source electrode and the drain electrode of the transistor TR illustrated in FIG. 3 and is formed in the Y-direction YD, that is the extending direction of the data signal lines, preferably overlap a portion of the plurality of data signal lines that are not illustrated, are formed in the Y-direction YD, and are formed in the layer forming the source electrode and the drain electrode of the transistor TR illustrated in FIG. 3.

As illustrated in FIG. 16, the subpixel circuit (sixth subpixel circuit) provided in the upper right side of the sparse pixel region MBR, specifically, the subpixel circuit relating to the green subpixel GSP', and the scanning signal line SCALn−6 (third scanning signal line) formed following the edge portion of the sparse pixel region MBR are electrically connected via the second wiring line SCAL'n−6 including a portion formed in the Y-direction YD, that is the extending direction of the data signal lines. Since the second wiring lines SCAL'n−6 and SCAL"n−6, which are portions of the scanning signal line SCALn−6, intersect the scanning signal lines SCALn−1 to SCALn−5, SCALn+2, SCALn+6, and SCALn+7 formed following the edge portion of the sparse pixel region MBR, in the present embodiment, the second wiring lines SCAL'n−6 and SCAL"n−6 of the scanning signal line SCALn−6 and the portions of the scanning signal line SCALn−6 other than the second wiring lines SCAL'n−6 and SCAL"n−6 are formed in different layers. For example, the second wiring lines SCAL'n−6 and SCAL"n−6 of the scanning signal line SCALn−6 can be formed in a wiring line layer different from the layer forming the gate electrode of the transistor TR illustrated in FIG. 3 and different from the layer forming the source electrode and the drain electrode of the transistor TR illustrated in FIG. 3, and the portions of the scanning signal line SCALn−6 other than the second wiring lines SCAL'n−6 and SCAL"n−6 can be formed in the layer forming the gate electrode of the transistor TR illustrated in FIG. 3. Note that in a similar manner, the green subpixel GSP' provided in the upper left side of the sparse pixel region MBR is electrically connected to the scanning signal line SCALn−6 formed following the edge portion of the sparse pixel region MBR via the second wiring line SCAL"n−6.

As illustrated in FIG. 16, the subpixel circuit (sixth subpixel circuit) provided in the upper right side of the sparse pixel region MBR, specifically, the subpixel circuit relating to the blue subpixel BSP', and the scanning signal line SCALn−5 formed following the edge portion of the sparse pixel region MBR are electrically connected via the second wiring line SCAL'n−5 including a portion formed in the Y-direction YD, that is the extending direction of the data signal lines. Since the second wiring lines SCAL'n−5 and SCAL"n−5, which are portions of the scanning signal line SCALn−5, intersect the scanning signal lines SCALn−1 to SCALn−4, SCALn+2, SCALn+6, and SCALn+7 formed following the edge portion of the sparse pixel region MBR, in the present embodiment, the second wiring lines SCAL'n−5 and SCAL"n−5 of the scanning signal line SCALn−5 and the portions of the scanning signal line SCALn−5 other than the second wiring lines SCAL'n−5 and SCAL"n−5 are formed in different layers. For example, the second wiring lines SCAL'n−5 and SCAL"n−5 of the scanning signal line SCALn−5 can be formed in a wiring line layer different from the layer forming the gate electrode of the transistor TR illustrated in FIG. 3 and different from the layer forming the source electrode and the drain electrode of the transistor TR illustrated in FIG. 3, and the portions of the scanning signal line SCALn−5 other than the second wiring lines SCAL'n−5 and SCAL"n−5 can be formed in the layer forming the gate electrode of the transistor TR illustrated in FIG. 3. Note that in a similar manner, the red subpixel RSP' provided in the upper left side of the sparse pixel region MBR is electrically connected to the scanning signal line SCALn−5 formed following the edge portion of the sparse pixel region MBR via the second wiring line SCAL"n−5.

As illustrated in FIG. 16, the subpixel circuit (sixth subpixel circuit) provided in the central right side of the sparse pixel region MBR, specifically, the subpixel circuit relating to the green subpixel GSP', and the scanning signal line SCALn+6 formed following the edge portion of the sparse pixel region MBR are electrically connected via the second wiring line SCAL"n+6 including a portion formed in the Y-direction YD, that is the extending direction of the data signal lines. Since the second wiring lines SCAL'n+6, SCAL"n+6, SCAL'''n+6, and SCAL''''n+6, which are portions of the scanning signal line SCALn+6, intersect the scanning signal lines SCALn and SCALn+1 and the scanning signal line SCALn+7 formed following the edge portion of the sparse pixel region MBR, in the present embodiment, the second wiring lines SCAL'n+6, SCAL"n+6, SCAL'''n+6, and SCAL''''n+6 of the scanning signal line SCALn+6 and the portions of the scanning signal line SCALn+6 other than the second wiring lines SCAL'n+6, SCAL"n+6, SCAL'''n+6, and SCAL''''n+6 are formed in different layers. For example, the second wiring lines SCAL'n+6, SCAL"n+6, SCAL'''n+6, and SCAL''''n+6 of the scanning signal line SCALn+6 can be formed in a wiring line layer different from the layer forming the gate electrode of the transistor TR illustrated in FIG. 3 and different from the layer forming the source electrode and the drain electrode of the transistor TR illustrated in FIG. 3, and the portions of the scanning signal line SCALn+6 other than the second wiring lines SCAL'n+6, SCAL"n+6, SCAL'''n+6, and SCAL''''n+6 can be formed in the layer forming the gate electrode of the transistor TR illustrated in FIG. 3. Note that in a similar manner, the green subpixel GSP' provided in the central left side (section K in FIG. 16) of the sparse pixel region MBR is electrically connected to the scanning signal line SCALn+6 formed following the edge portion of the sparse pixel region MBR via the second wiring line SCAL'''n+6.

As illustrated in FIG. 16, the subpixel circuit (sixth subpixel circuit) provided in the central right side of the sparse pixel region MBR, specifically, the subpixel circuit relating to the blue subpixel BSP', and the scanning signal line SCALn+7 formed following the edge portion of the sparse pixel region MBR are electrically connected via the second wiring line SCAL"n+7 including a portion formed in the Y-direction YD, that is the extending direction of the data signal lines. Since the second wiring lines SCAL'n+7, SCAL"n+7, SCAL'"n+7, and SCAL'"n+7, which are portions of the scanning signal line SCALn+7, intersect the scanning signal lines SCALn and SCALn+1, in the present embodiment, the second wiring lines SCAL'n+7, SCAL"n+7, SCAL'"n+7, and SCAL'"n+7 of the scanning signal line SCALn+7 and the portions of the scanning signal line SCALn+7 other than the second wiring lines SCAL'n+7, SCAL"n+7, SCAL'"n+7, and SCAL'"n+7 are formed in different layers. For example, the second wiring lines SCAL'n+7, SCAL"n+7, SCAL'"n+7, and SCAL""n+7 of the scanning signal line SCALn+7 can be formed in a wiring line layer different from the layer forming the gate electrode of the transistor TR illustrated in FIG. 3 and different from the layer forming the source electrode and the drain electrode of the transistor TR illustrated in FIG. 3, and the portions of the scanning signal line SCALn+7 other than the second wiring lines SCAL'n+7, SCAL"n+7, SCAL'"n+7, and SCAL""n+7 can be formed in the layer forming the gate electrode of the transistor TR illustrated in FIG. 3. Note that in a similar manner, the red subpixel RSP' provided in the central left side (section K in FIG. 16) of the sparse pixel region MBR is electrically connected to the scanning signal line SCALn+7 formed following the edge portion of the sparse pixel region MBR via the second wiring line SCAL'"n+7.

The second wiring lines of the scanning signal line SCALn+2, the second wiring lines of the scanning signal line SCALn−6, the second wiring lines of the scanning signal line SCALn−5, the second wiring lines of the scanning signal line SCALn+6, and the second wiring lines of the scanning signal line SCALn+7 described above preferably overlap a portion of the plurality of data signal lines that are not illustrated and are formed in the Y-direction YD.

As indicated by a broken line J in FIG. 16, the scanning signal line SCALn (first scanning signal line), which is one of the plurality of scanning signal lines provided in the display region DA, is also formed in the sparse pixel region MBR in the extending direction (X-direction XD in FIG. 16) of the scanning signal lines provided in the display region DA. The scanning signal line SCALn+1 (second scanning signal line), which is one of the plurality of scanning signal lines provided in the display region DA and most adjacent to the scanning signal line SCALn (first scanning signal line), is also formed in the sparse pixel region MBR in the extending direction (X-direction XD in FIG. 16) of the scanning signal lines provided in the display region DA.

As indicated by the broken line J in FIG. 16, the subpixel circuit (fourth subpixel circuit) provided in the central right side of the sparse pixel region MBR and the scanning signal line SCALn (first scanning signal line) are electrically connected. Specifically, the subpixel circuit relating to the green subpixel GSP' and the scanning signal line SCALn (first scanning signal line) are electrically connected. Also, as indicated by the broken line J in FIG. 16, the subpixel circuit (fifth subpixel circuit) provided in the central right side of the sparse pixel region MBR and the scanning signal line SCALn+1 (second scanning signal line) are electrically connected. Specifically, the subpixel circuit relating to the red subpixel RSP' and the scanning signal line SCALn+1 (second scanning signal line) are electrically connected. In a similar manner, the subpixel circuit (fourth subpixel circuit) provided in the central left side of the sparse pixel region MBR and the scanning signal line SCALn (first scanning signal line) are electrically connected. Specifically, the subpixel circuit relating to the green subpixel GSP' and the scanning signal line SCALn (first scanning signal line) are electrically connected. Also, the subpixel circuit (fifth subpixel circuit) provided in the central left side of the sparse pixel region MBR and the scanning signal line SCALn+1 (second scanning signal line) are electrically connected. Specifically, the subpixel circuit relating to the blue subpixel BSP' and the scanning signal line SCALn+1 (second scanning signal line) are electrically connected.

Figure 17:
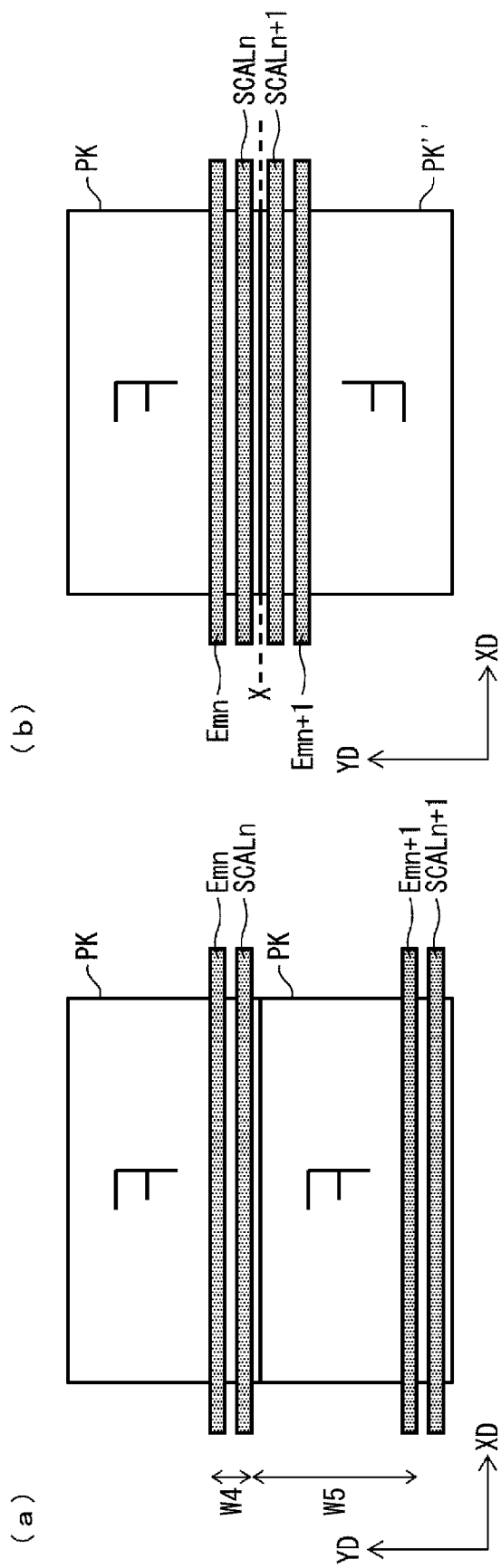
FIG. 17(a) is a diagram illustrating a case in which two of the subpixel circuits illustrated in FIG. 5 are provided and the scanning signal lines and emission control lines do not overlap in a plan view.
FIG. 17(b) is a diagram illustrating a case in which the subpixel circuit illustrated in FIG. 5 and the subpixel circuit illustrated in FIG. 12 are provided and the scanning signal lines and the emission control lines do not overlap in a plan view.

(a) of FIG. 17 is a diagram illustrating a case in which two of the subpixel circuits PK illustrated in FIG. 5 are provided and the scanning signal lines SCALn and SCALn+1 and the emission control lines Emn and Emn+1 do not overlap in a plan view. (b) of FIG. 17 is a diagram illustrating a case in which the subpixel circuit PK illustrated in FIG. 5 and the subpixel circuit PK" illustrated in FIG. 12 are provided and the scanning signal lines SCALn and SCALn+1 and the emission control lines Emn and Emn+1 do not overlap in a plan view.

In a case in which, as described above, the scanning signal line SCALn (first scanning signal line), which is one of the plurality of scanning signal lines provided in the display region DA, and the scanning signal line SCALn+1 (second scanning signal line), which is one of the plurality of scanning signal lines provided in the display region DA and most adjacent to the scanning signal line SCALn (first scanning signal line), are also formed in the sparse pixel region MBR in the extending direction (X-direction XD in FIG. 16) of the scanning signal lines provided in the display region DA, the following points are preferably taken into account.

As illustrated in (a) of FIG. 17, in the case of a configuration provided with two of the subpixel circuits PK illustrated in FIG. 5 (or a configuration provided with two of the subpixel circuits PK' illustrated in FIG. 6), a wiring line pitch W4 between the scanning signal line SCALn and the emission control line Emn and the wiring line pitch W4 between the scanning signal line SCALn+1 and the emission control line Emn+1 are approximately a few μm, and a pixel pitch W5 between the scanning signal line SCALn and the emission control line Emn+1 is approximately a few tens of μm. Thus, as illustrated in (a) of FIG. 17, in the case of a configuration provided with two of the subpixel circuits PK (or a configuration provided with two of the subpixel circuits PK' illustrated in FIG. 6), diffraction light is caused by the wiring line pitch W4 and the pixel pitch W5. Accordingly, the diffraction effect when light from a subject is guided to the light receiving unit of the camera CM through the sparse pixel region MBR can be reduced.

As illustrated in (b) of FIG. 17, in the case of a configuration provided with the subpixel circuit PK illustrated in FIG. 5 and the subpixel circuit PK" illustrated in FIG. 12 symmetrically disposed with respect to an axis of symmetry X corresponding to the extending direction (X-direction XD) of the scanning signal lines provided in the display region DA, the pixel pitch W5 illustrated in (a) of FIG. 17 is approximately doubled and the occurrence of diffraction light caused by the pixel pitch W5 is suppressed. Accordingly, the diffraction effect when light from a subject is guided to the light receiving unit of the camera CM through the sparse pixel region MBR can be reduced.

With the configuration illustrated in (b) of FIG. 17, as illustrated in FIG. 16, the pitch between the scanning signal line SCALn and the scanning signal line SCALn+1 provided in the sparse pixel region MBR can be made smaller than the pitch between adjacent data signal lines provided in the display region DA.

Figure 18:
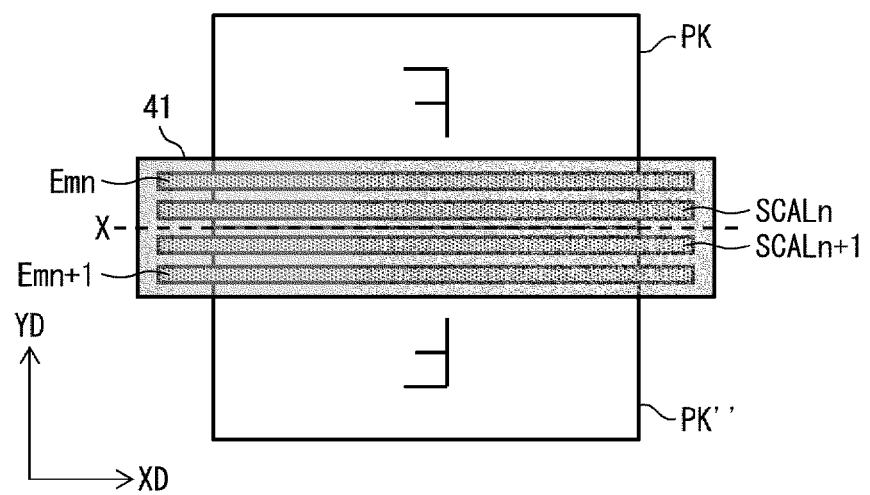
FIG. 18 is a diagram illustrating a case in which the light blocking layer is formed above the scanning signal lines and the emission control lines illustrated in (b) of FIG. 17.

FIG. 18 is a diagram illustrating a case in which the light blocking layer 41 is formed above the scanning signal lines SCALn and SCALn+1 and the emission control lines Emn and Emn+1 illustrated in (b) of FIG. 17.

As illustrated in FIG. 18, by providing the light blocking layer 41 above the scanning signal lines SCALn and SCALn+1 and the emission control lines Emn and Emn+1, the occurrence of diffraction light caused by the wiring line pitch W4 illustrated in (a) of FIG. 17 and the wiring line pitch between the scanning signal line SCALn and the scanning signal line SCALn+1 can be suppressed. Accordingly, the diffraction effect when light from a subject is guided to the light receiving unit of the camera CM through the sparse pixel region MBR can be reduced. Since the pitch of the light blocking layer 41 corresponds to the pitch (approximately a few hundreds of μm) between the subpixels provided in the sparse pixel region MBR, making it far from the visible light wavelength, the diffraction light caused by the effects of the pitch of the light blocking layer 41 is greatly reduced. In this manner, when the light blocking layer 41 is provided, a decrease in transmittance can be further reduced.

Also, though not illustrated in FIG. 16, the light blocking layer 41 is preferably formed above at least a portion of the wiring lines formed in the sparse pixel region MBR. With such a configuration, the occurrence of diffraction light caused by the wiring line pitch between the wiring lines formed in the sparse pixel region MBR can be suppressed. Accordingly, the diffraction effect when light from a subject is guided to the light receiving unit of the camera CM through the sparse pixel region MBR can be reduced.

As indicated by a broken line L in FIG. 16, the scanning signal line SCALn+12 (first scanning signal line), which is one of the plurality of scanning signal lines provided in the display region DA, and the scanning signal line SCALn+13 (second scanning signal line), which is one of the plurality of scanning signal lines provided in the display region DA and most adjacent to the scanning signal line SCALn+12 (first scanning signal line), are also formed in the sparse pixel region MBR in the extending direction (X-direction XD in FIG. 16) of the scanning signal lines provided in the display region DA.

In the sparse pixel region MBR, the scanning signal line SCALn+12 (first scanning signal line) and the scanning signal line SCALn+13 (second scanning signal line) are preferably formed in different layers. For example, in the sparse pixel region MBR, the scanning signal line SCALn+12 (first scanning signal line) can be formed in the layer forming the gate electrode of the transistor TR illustrated in FIG. 3, and the scanning signal line SCALn+13 (second scanning signal line), specifically a portion SCAL'n+13 of the scanning signal line SCALn+13, can be formed in a wiring line layer different from the layer forming the gate electrode of the transistor TR illustrated in FIG. 3 and different from the layer forming the source electrode and the drain electrode of the transistor TR illustrated in FIG. 3.

Figure 19:
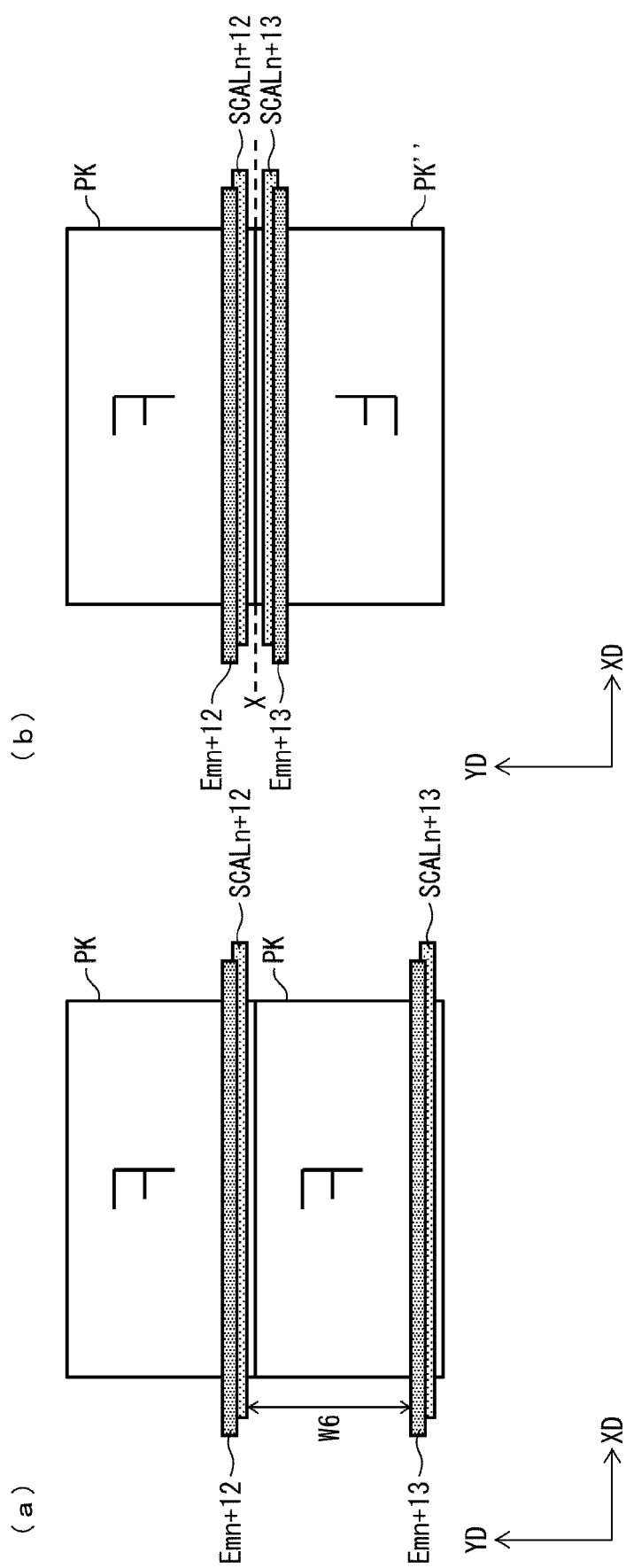
FIG. 19(a) is a diagram illustrating a case in which two of the subpixel circuits illustrated in FIG. 5 are provided and the scanning signal lines and emission control lines overlap in a plan view.
FIG. 19(b) is a diagram illustrating a case in which the subpixel circuit illustrated in FIG. 5 and the subpixel circuit illustrated in FIG. 12 are provided and the scanning signal lines and the emission control lines overlap in a plan view.

(a) of FIG. 19 is a diagram illustrating a case in which two of the subpixel circuits PK illustrated in FIG. 5 are provided and the scanning signal lines SCALn+12 and SCALn+13 and the emission control lines Emn+12 and Emn+13 overlap in a plan view. (b) of FIG. 19 is a diagram illustrating a case in which the subpixel circuit PK illustrated in FIG. 5 and the subpixel circuits PK" illustrated in FIG. 12 are provided and the scanning signal lines SCALn+12 and SCALn+13 and the emission control lines Emn+12 and Emn+13 overlap in a plan view. For example, in the sparse pixel region MBR, the scanning signal line SCALn+12 (first scanning signal line) and the scanning signal line SCALn+13 (second scanning signal line) can be formed in the layer forming the gate electrode of the transistor TR illustrated in FIG. 3, and the emission control lines Emn+12 and Emn+13 can be formed in a wiring line layer different from the layer forming the gate electrode of the transistor TR illustrated in FIG. 3 and different from the layer forming the source electrode and the drain electrode of the transistor TR illustrated in FIG. 3.

As illustrated in (a) of FIG. 19, in the case of a configuration provided with two of the subpixel circuits PK illustrated in FIG. 5 (or a configuration provided with two of the subpixel circuits PK' illustrated in FIG. 6), a pixel pitch W6 between a first wiring line region where the scanning signal line SCALn+12 and the emission control line Emn+12 overlap in a plan view and a second wiring line region where the scanning signal line SCALn+13 and the emission control line Emn+13 overlap in a plan view is approximately a few tens of μm. Thus, as illustrated in (a) of FIG. 19, in the case of a configuration provided with two of the subpixel circuits PK (or a configuration provided with two of the subpixel circuits PK' illustrated in FIG. 6), diffraction light is caused by the pixel pitch W6. Accordingly, the spectrally separated light (light colored by a diffraction effect) from a subject is guided to the light receiving unit of the camera CM through the sparse pixel region MBR.

As illustrated in (b) of FIG. 19, in the case of a configuration provided with the subpixel circuit PK illustrated in FIG. 5 and the subpixel circuit PK" illustrated in FIG. 12 symmetrically disposed with respect to an axis of symmetry X corresponding to the extending direction (X-direction XD) of the scanning signal lines provided in the display region DA, the pixel pitch W6 illustrated in (a) of FIG. 19 is approximately doubled and the occurrence of diffraction light caused by the pixel pitch W6 is suppressed. Accordingly, the diffraction effect when light from a subject is guided to the light receiving unit of the camera CM through the sparse pixel region MBR can be reduced.

With the configuration illustrated in (b) of FIG. 19, as illustrated in FIG. 16, the pitch between the scanning signal line SCALn+12 and the scanning signal line SCALn+13 provided in the sparse pixel region MBR can be made smaller than the pitch between adjacent data signal lines provided in the display region DA.

Figure 20:
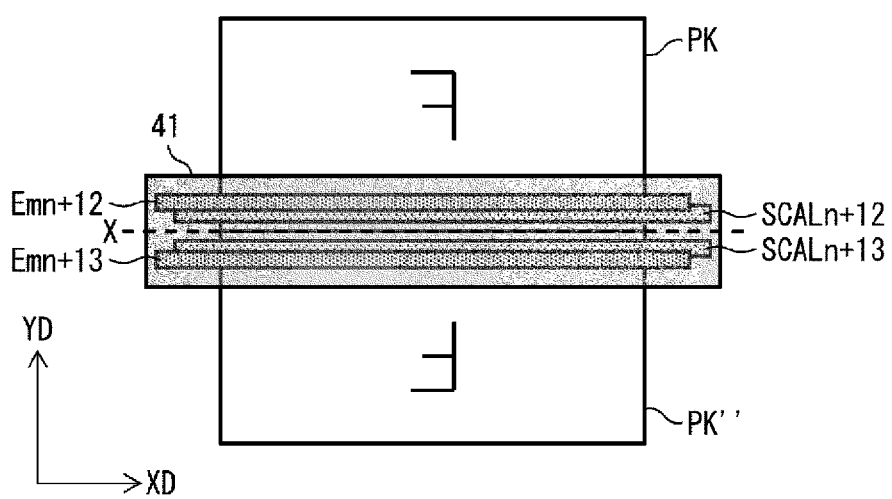
FIG. 20 is a diagram illustrating a case in which the light blocking layer is formed above the scanning signal lines and the emission control lines illustrated in (b) of FIG. 19.

FIG. 20 is a diagram illustrating a case in which the light blocking layer 41 is formed above the scanning signal lines SCALn+12 and SCALn+13 and the emission control lines Emn+12 and Emn+13 illustrated in (b) of FIG. 19.

As illustrated in FIG. 20, by providing the light blocking layer 41 above the scanning signal lines SCALn+12 and SCALn+13 and the emission control lines Emn+12 and Emn+13, the occurrence of diffraction light caused by the wiring line pitch between the first wiring line region where the scanning signal line SCALn+12 and the emission control line Emn+12 illustrated in (b) of FIG. 19 overlap in a plan view and the second wiring line region where the scanning signal line SCALn+13 and the emission control line Emn+13 overlap in a plan view can be suppressed. Accordingly, the diffraction effect when light from a subject is guided to the light receiving unit of the camera CM through the sparse pixel region MBR can be reduced. In this manner, when the light blocking layer 41 is provided, a decrease in transmittance can be further reduced.

Figure 21:
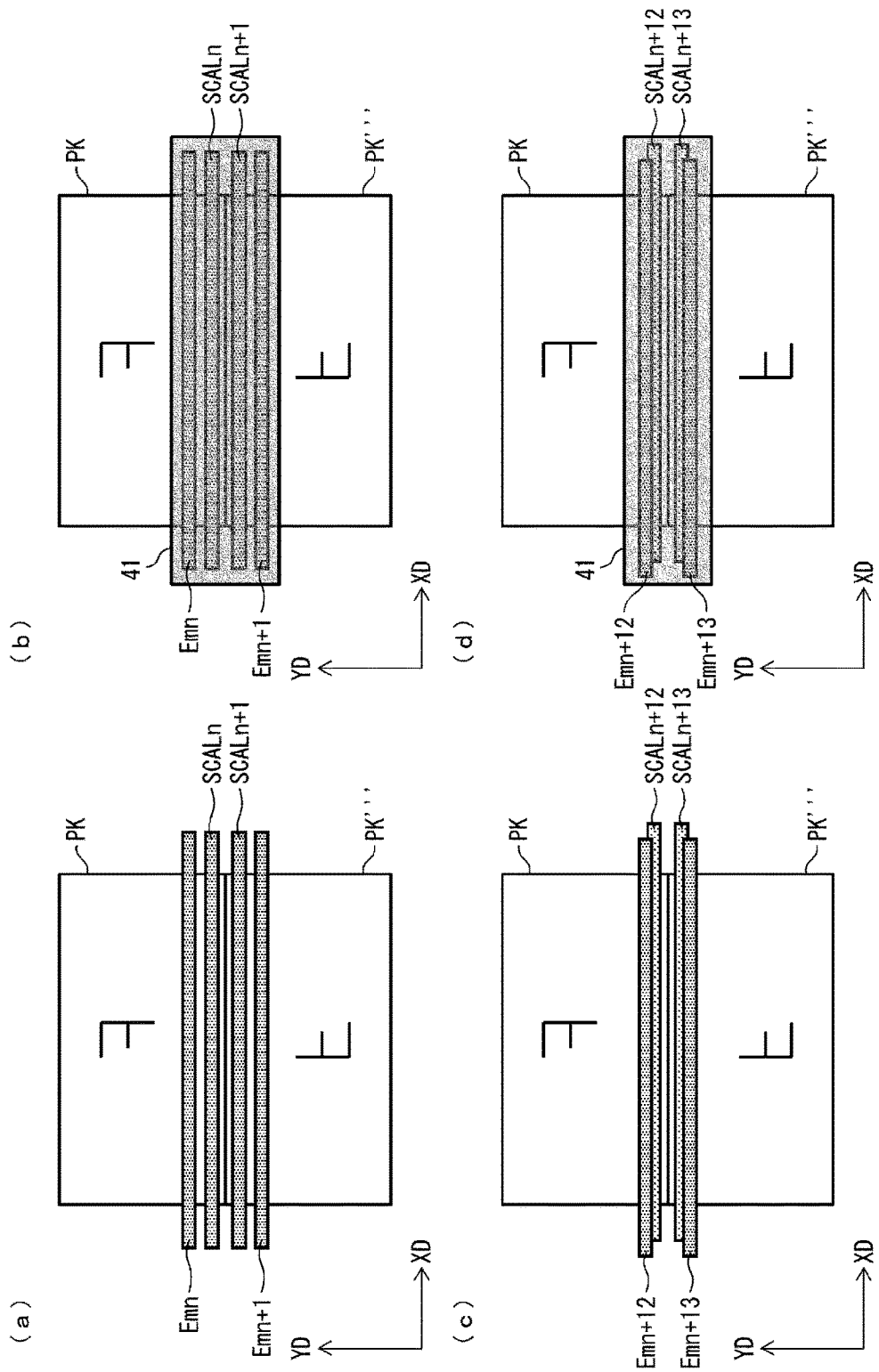
FIG. 21(a) is a diagram illustrating a case in which the subpixel circuit illustrated in FIG. 5 and a subpixel circuit inverted 180° on a plane from the subpixel circuit illustrated in FIG. 5 are provided and the scanning signal lines and the emission control lines do not overlap in a plan view.
FIG. 21(b) is a diagram illustrating a case in which the light blocking layer is formed above the scanning signal lines and the emission control lines illustrated in FIG. 21(a).
FIG. 21(c) is a diagram illustrating a case in which the subpixel circuit illustrated in FIG. 5 and a subpixel circuit inverted 180° on a plane from the subpixel circuit illustrated in FIG. 5 are provided and the scanning signal lines and the emission control lines overlap in a plan view.
FIG. 21(d) is a diagram illustrating a case in which the light blocking layer is formed above the scanning signal lines and the emission control lines illustrated in FIG. 21(c).

(a) of FIG. 21 is a diagram illustrating a case in which the subpixel circuit PK illustrated in FIG. 5 and a subpixel circuit PK''' inverted 180° on the plane from the subpixel circuit PK illustrated in FIG. 5 are provided and the scanning signal lines SCALn and SCALn+1 and the emission control lines Emn and Emn+1 do not overlap in a plan view. (b) of FIG. 21 is a diagram illustrating a case in which the light blocking layer 41 is formed above the scanning signal lines SCALn and SCALn+1 and the emission control lines Emn and Emn+1 illustrated in (a) of FIG. 21. (c) of FIG. 21 is a diagram illustrating a case in which the subpixel circuit PK illustrated in FIG. 5 and the subpixel circuit PK''' inverted 180° on the plane from the subpixel circuit PK illustrated in FIG. 5 are provided and the scanning signal lines SCALn+12 and SCALn+13 and the emission control lines Emn+12 and Emn+13 overlap in a plan view. (d) of FIG. 21 is a diagram illustrating a case in which the light blocking layer 41 is formed above the scanning signal lines SCALn+12 and SCALn+13 and the emission control lines Emn+12 and Emn+13 illustrated in (c) of FIG. 21.

As illustrated in (a) of FIG. 21, in the case of a configuration provided with the subpixel circuit PK illustrated in FIG. 5 and the subpixel circuit PK' inverted 180° on the plane from the subpixel circuit PK illustrated in FIG. 5, the pixel pitch W5 illustrated in (a) of FIG. 17 is approximately doubled and the occurrence of diffraction light caused by the pixel pitch W5 is suppressed. Accordingly, the diffraction effect when light from a subject is guided to the light receiving unit of the camera CM through the sparse pixel region MBR can be reduced.

With the configuration illustrated in (a) of FIG. 21, as illustrated in FIG. 16, the pitch between the scanning signal line SCALn and the scanning signal line SCALn+1 provided in the sparse pixel region MBR can be made smaller than the pitch between adjacent scanning signal lines provided in the display region DA.

As illustrated in (b) of FIG. 21, by providing the light blocking layer 41 above the scanning signal lines SCALn and SCALn+1 and the emission control lines Emn and Emn+1, the occurrence of diffraction light caused by the wiring line pitch W4 illustrated in (a) of FIG. 17 and the wiring line pitch between the scanning signal line SCALn and the scanning signal line SCALn+1 can be suppressed. Accordingly, the diffraction effect when light from a subject is guided to the light receiving unit of the camera CM through the sparse pixel region MBR can be reduced. Since the pitch of the light blocking layer 41 corresponds to the pitch (approximately a few hundreds of μm) between the subpixels provided in the sparse pixel region MBR, making it far from the visible light wavelength, the diffraction light caused by the effects of the pitch of the light blocking layer 41 is greatly reduced. In this manner, when the light blocking layer 41 is provided, a decrease in transmittance can be further reduced.

As illustrated in (c) of FIG. 21, in the case of a configuration provided with the subpixel circuit PK illustrated in FIG. 5 and the subpixel circuit PK' inverted 180° on the plane from the subpixel circuit PK illustrated in FIG. 5 and the scanning signal lines SCALn+12 and SCALn+13 and the emission control lines Emn+12 and Emn+13 overlapping in a plan view, the pixel pitch W6 illustrated in (a) of FIG. 19 is approximately doubled and the occurrence of diffraction light caused by the pixel pitch W6 is suppressed. Accordingly, the diffraction effect when light from a subject is guided to the light receiving unit of the camera CM through the sparse pixel region MBR can be reduced.

With the configuration illustrated in (c) of FIG. 21, as illustrated in FIG. 16, the pitch between the scanning signal line SCALn+12 and the scanning signal line SCALn+13 provided in the sparse pixel region MBR can be made smaller than the pitch between adjacent scanning signal lines provided in the display region DA.

As illustrated in (d) of FIG. 21, by providing the light blocking layer 41 above the scanning signal lines SCALn+12 and SCALn+13 and the emission control lines Emn+12 and Emn+13, the occurrence of diffraction light caused by the wiring line pitch between the first wiring line region where the scanning signal line SCALn+12 and the emission control line Emn+12 overlap in a plan view and the second wiring line region where the scanning signal line SCALn+13 and the emission control line Emn+13 overlap in a plan view can be suppressed. Accordingly, the diffraction effect when light from a subject is guided to the light receiving unit of the camera CM through the sparse pixel region MBR can be reduced. In this manner, when the light blocking layer 41 is provided, a decrease in transmittance can be further reduced.

In the example of the present embodiment described above, in the display region DA on the upper side of the sparse pixel region MBR, the display region DA on the lower side of the sparse pixel region MBR, and the sparse pixel region MBR, the plurality of data signal lines are linearly formed in the Y-direction YD. However, no such limitation is intended, and, for example, in the display region DA on the upper side of the sparse pixel region MBR, the display region DA on the lower side of the sparse pixel region MBR, and the sparse pixel region MBR, the arrangement of the data signal lines according to the first embodiment described above may be used as appropriate.

Supplement

First Aspect

A display device includes:
 a plurality of scanning signal lines;
 a plurality of data signal lines; and
 a plurality of subpixel circuits disposed at least at some of intersection points of the plurality of scanning signal lines and the plurality of data signal lines, each one of the plurality of subpixel circuits including a control circuit including a transistor and a light-emitting element,
wherein an average density of subpixel circuits provided in a display region (number of subpixel circuits provided in the display region/area of a display region) is greater than an average density of subpixel circuits provided in a sparse pixel region (number of subpixel circuits provided in the sparse pixel region/area of a sparse pixel region), and
the sparse pixel region includes a no-pixel region not including the subpixel circuits in one entire line in an extending direction of the scanning signal lines or the data signal lines provided in the display region.

Second Aspect

In the display device according to the first aspect,
 a first data signal line corresponding to one of the plurality of data signal lines provided in the display region is formed also in the sparse pixel region in an extending direction of the data signal lines provided in the display region,
 a second data signal line corresponding to one of the plurality of data signal lines provided in the display region and provided most adjacent to the first data signal line is formed in the sparse pixel region also in an extending direction of the data signal lines provided in the display region, one of a first subpixel circuit and a second subpixel circuit of the plurality of subpixel circuits provided in the sparse pixel region is electrically connected to the first data signal line, and the other of the first subpixel circuit and the second subpixel circuit is electrically connected to the second data signal line.

Third Aspect

In the display device according to the second aspect, the first subpixel circuit and the second subpixel circuit are symmetrically disposed with respect to an axis of symmetry corresponding to the extending direction of the data signal lines provided in the display region.

Fourth Aspect

In the display device according to the second aspect, when the first subpixel circuit is inverted 180° on the plane, the first subpixel circuit coincides with the second subpixel circuit.

Fifth Aspect

In the display device according to any one of the second to fourth aspects, in the sparse pixel region, the first data signal line and the second data signal line are formed in different layers.

Sixth Aspect

In the display device according to any one of the first to fifth aspect, a third data signal line corresponding to one of the plurality of data signal lines provided in the display region is formed in the sparse pixel region following an edge portion of the sparse pixel region.

Seventh Aspect

In the display device according to the sixth aspect, the third data signal line is formed in a layer different from a layer of the display region in a portion of the sparse pixel region.

Eighth Aspect

In the display device according to the sixth or seventh aspect, a third subpixel circuit of the plurality of subpixel circuits provided in the sparse pixel region is electrically connected to the third data signal line formed following the edge portion of the sparse pixel region, and a first wiring line electrically connecting the third data signal line formed following the edge portion of the sparse pixel region and the third subpixel circuit is formed in a layer different from a layer of the third data signal line provided in the display region.

Ninth Aspect

In the display device according to the seventh aspect, in a portion of the sparse pixel region, the third data signal line formed in a layer different from a layer of the display region overlaps a portion of the plurality of scanning signal lines formed in the sparse pixel region in a plan view.

Tenth Aspect

In the display device according to the eighth aspect, the first wiring line overlaps a portion of the plurality of scanning signal lines formed in the sparse pixel region in a plan view.

Eleventh Aspect

In the display device according to the third or fourth aspect, a distance between the first data signal line and the second data signal line in the sparse pixel region is less than a distance between the first data signal line and the second data signal line in the display region.

Twelfth Aspect

In the display device according to the first aspect, a first scanning signal line corresponding to one of the plurality of scanning signal lines provided in the display region is formed also in the sparse pixel region in the extending direction of the scanning signal lines provided in the display region, a second scanning signal line corresponding to one of the plurality of scanning signal lines provided in the display region and provided most adjacent to the first scanning signal line is formed in the sparse pixel region also in the extending direction of the scanning signal lines provided in the display region, one of a fourth subpixel circuit and a fifth subpixel circuit of the plurality of subpixel circuits provided in the sparse pixel region is electrically connected to the first scanning signal line, and the other of the fourth subpixel circuit and the fifth subpixel circuit is electrically connected to the second scanning signal line.

Thirteenth Aspect

In the display device according to the twelfth aspect, the fourth subpixel circuit and the fifth subpixel circuit are symmetrically disposed with respect to an axis of symmetry corresponding to the extending direction of the scanning signal lines provided in the display region.

Fourteenth Aspect

In the display device according to the twelfth aspect, when the fourth subpixel circuit is inverted 180° on the plane, the fourth subpixel circuit coincides with the fifth subpixel circuit.

Fifteenth Aspect

In the display device according to any one of the twelfth to fourteenth aspect, in the sparse pixel region, the first scanning signal line and the second scanning signal line are formed in different layers.

Sixteenth Aspect

In the display device according to any one of the twelfth to fifteenth aspect, a third scanning signal line corresponding to one of the plurality of scanning signal lines provided in the display region is formed in the sparse pixel region following an edge portion of the sparse pixel region.

Seventeenth Aspect

In the display device according to the sixteenth aspect, the third scanning signal line is formed in a layer different from a layer of the display region in a portion of the sparse pixel region.

Eighteenth Aspect

In the display device according to the sixteenth or seventeenth aspect, a sixth subpixel circuit of the plurality of subpixel circuits provided in the sparse pixel region is electrically connected to the third scanning signal line formed following the edge portion of the sparse pixel region, and a second wiring line electrically connecting the third scanning signal line formed following the edge portion of the sparse pixel region and the sixth subpixel circuit is formed in a layer different from a layer of the third scanning signal line provided in the display region.

Nineteenth Aspect

In the display device according to the seventeenth aspect, in a portion of the sparse pixel region, the third scanning signal line formed in a layer different from a layer of the display region overlaps a portion of the plurality of data signal lines formed in the sparse pixel region in a plan view.

Twentieth Aspect

In the display device according to the eighteenth aspect, the second wiring line overlaps a portion of the plurality of data signal lines formed in the sparse pixel region in a plan view.

Twenty-first Aspect

In the display device according to the thirteenth or fourteenth aspect, a distance between the first scanning signal line and the second scanning signal line in the sparse pixel region is less than a distance between the first scanning signal line and the second scanning signal line in the display region.

Twenty-second Aspect

In the display device according to any one of the first to twenty-first aspect, a light blocking layer is formed in at least a portion above a wiring line formed in the sparse pixel region.

Twenty-third Aspect

The display device according to any one of first to twenty-second aspect, further including:
an imaging element,
wherein the imaging element overlaps the sparse pixel region in a plan view.

Appendix

The disclosure is not limited to each of the embodiments described above, and various modifications may be made within the scope of the claims. Embodiments obtained by appropriately combining technical approaches disclosed in each of the different embodiments also fall within the technical scope of the disclosure. Furthermore, novel technical features can be formed by combining the technical approaches disclosed in each of the embodiments.

INDUSTRIAL APPLICABILITY

The disclosure can be utilized for a display device or the like.

The invention claimed is:

1. A display device comprising:
a plurality of scanning signal lines;
a plurality of data signal lines; and
a plurality of subpixel circuits disposed at least at one or more intersection points of the plurality of scanning signal lines and the plurality of data signal lines, each of the plurality of subpixel circuits including a control circuit having a transistor and a light-emitting element,
wherein an average density of the plurality of subpixel circuits provided in a display region, which is a number of the plurality of subpixel circuits provided in the display region over an area of the display region, is greater than an average density of the plurality of subpixel circuits provided in a sparse pixel region, which is another number of the plurality of subpixel circuits provided in the sparse pixel region over an area of the sparse pixel region,
the sparse pixel region includes a no-pixel region not including any of the plurality of subpixel circuits in one entire line in an extending direction of the plurality of scanning signal lines in the display region or an extending direction of the plurality of data signal lines provided in the display region,
a first data signal line corresponding to one of the plurality of data signal lines provided in the display region is formed also in the sparse pixel region in the extending direction of the plurality of data signal lines provided in the display region,
a second data signal line corresponding to another one of the plurality of data signal lines provided in the display region and provided most adjacent to the first data signal line is formed in the sparse pixel region also in the extending direction of the plurality of data signal lines provided in the display region,
a first sparse region subpixel circuit of the plurality of subpixel circuits provided in the sparse pixel region is electrically connected to the first data signal line,
a second sparse region subpixel circuit of the plurality of subpixel circuits provided in the sparse pixel region is electrically connected to the second data signal line,
a first display region subpixel circuit of the plurality of subpixel circuits provided in the display region is electrically connected to the first data signal line,
a second display region subpixel circuit of the plurality of subpixel circuits provided in the display region is electrically connected to the second data signal line, and
a distance between a portion of the first data signal line, laid in the first sparse region subpixel circuit, and a portion of the second data signal line, laid in the second sparse region subpixel circuit that is most adjacent to the first sparse region subpixel circuit, is shorter than a distance between a portion of the first data signal line, laid in the first display region subpixel circuit, and a portion of the second data signal line, laid in the second display region subpixel circuit that is most adjacent to the first display region subpixel circuit.

2. The display device according to claim 1,
wherein the first sparse region subpixel circuit and the second sparse region subpixel circuit are symmetrically disposed with respect to an axis of symmetry corresponding to the extending direction of the plurality of data signal lines provided in the display region.

3. The display device according to claim 1,
wherein, when the first sparse region subpixel circuit is inverted 180° on a plane, the first sparse region subpixel circuit coincides with the second sparse region subpixel circuit.

4. The display device according to claim 1,
wherein in the sparse pixel region, the first data signal line and the second data signal line are formed in different layers.

5. The display device according to claim 1,
wherein a third data signal line corresponding to one of the plurality of data signal lines provided in the display region is formed in the sparse pixel region following an edge portion of the sparse pixel region.

6. The display device according to claim 5,
wherein the third data signal line is formed in a layer different from a layer of the display region in a portion of the sparse pixel region.

7. The display device according to claim 6,
wherein, in the portion of the sparse pixel region, the third data signal line overlaps a portion of the plurality of scanning signal lines formed in the sparse pixel region in a plan view.

8. The display device according to claim 5,
wherein a third subpixel circuit of the plurality of subpixel circuits provided in the sparse pixel region is electrically connected to the third data signal line formed following the edge portion of the sparse pixel region, and
a first wiring line electrically connecting the third data signal line formed following the edge portion of the sparse pixel region and the third subpixel circuit is formed in a layer different from a layer of the third data signal line provided in the display region.

9. The display device according to claim 8, wherein the first wiring line overlaps a portion of the plurality of scanning signal lines formed in the sparse pixel region in a plan view.

10. The display device according to claim 1, wherein a distance between the first data signal line and the second data signal line in the sparse pixel region is less than a distance between the first data signal line and the second data signal line in the display region, and is constant.

* * * * *